US011177359B2

(12) United States Patent
Anezaki et al.

(10) Patent No.: US 11,177,359 B2
(45) Date of Patent: Nov. 16, 2021

(54) SEMICONDUCTOR DEVICE AND MANUFACTURING METHOD OF SEMICONDUCTOR DEVICE

(71) Applicant: United Semiconductor Japan Co. Ltd., Kuwana (JP)

(72) Inventors: Toru Anezaki, Kuwana (JP); Fumitaka Ohno, Kuwana (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 16 days.

(21) Appl. No.: 16/807,614

(22) Filed: Mar. 3, 2020

(65) Prior Publication Data

US 2020/0287009 A1 Sep. 10, 2020

(30) Foreign Application Priority Data

Mar. 6, 2019 (JP) .............................. JP2019-040830

(51) Int. Cl.
| H01L 29/165 | (2006.01) |
| H01L 27/092 | (2006.01) |
| H01L 29/423 | (2006.01) |
| H01L 29/66 | (2006.01) |
| H01L 29/06 | (2006.01) |

(52) U.S. Cl.
CPC ...... *H01L 29/42356* (2013.01); *H01L 27/092* (2013.01); *H01L 29/0653* (2013.01); *H01L 29/66545* (2013.01)

(58) Field of Classification Search
None
See application file for complete search history.

(56) References Cited

U.S. PATENT DOCUMENTS

| 2007/0007617 A1* | 1/2007 | Nakamura ............. H01L 27/11 257/503 |
| 2010/0117120 A1* | 5/2010 | Yamashita .......... H01L 29/7833 257/206 |
| 2014/0210007 A1 | 7/2014 | Deval et al. |
| 2016/0049498 A1* | 2/2016 | Cheng ............... H01L 29/66651 257/327 |

FOREIGN PATENT DOCUMENTS

| JP | 10-98117 A | 4/1998 |
| JP | 2016-508671 A | 3/2016 |
| WO | 2014/120824 A1 | 8/2014 |

* cited by examiner

*Primary Examiner* — Joseph C. Nicely
*Assistant Examiner* — Lamont B Koo
(74) *Attorney, Agent, or Firm* — Winston Hsu

(57) ABSTRACT

A semiconductor device includes a semiconductor substrate, a gate electrode disposed over the semiconductor substrate and extending in a first direction, a dummy gate electrode disposed over the semiconductor substrate away from the gate electrode and extending in the first direction, a first semiconductor area of a first conductive type disposed in a surface layer portion of the semiconductor substrate between the gate electrode and the dummy gate electrode, and a conductor electrically connecting the first semiconductor area with the dummy gate electrode.

16 Claims, 21 Drawing Sheets

SEMICONDUCTOR DEVICE AND MANUFACTURING METHOD OF SEMICONDUCTOR DEVICE

CROSS-REFERENCE TO RELATED APPLICATIONS

The present application is based upon and claims the benefit of priority from the prior Japanese Patent Application No. 2019-040830 filed on Mar. 6, 2019, with the Japanese Patent Office, the entire contents of which are incorporated herein by reference.

FIELD

The disclosures herein relate to a semiconductor device and a manufacturing method of the semiconductor device.

BACKGROUND

Conventionally, a gate length of a gate electrode included in a transistor of a semiconductor device may deviate from a design value. For example, in a semiconductor device including a plurality of gate electrodes arranged at regular intervals and extending in one direction, the gate length may be different between the outermost gate electrode and the inner gate electrode. The gate length sometimes may deviate from the design value in a gate electrode in an isolated pattern where there is no other gate electrode. One of causes of this deviation is a difference in a pattern density of an exposure mask used for exposure when the gate electrode is formed. Therefore, a dummy gate electrode may be provided at the side of the gate electrode of the actually operated transistor to improve the uniformity of the pattern density of the exposure mask.

However, in the semiconductor device in which the dummy gate electrode is provided as described above, a leakage current tends to increase.

RELATED-ART DOCUMENTS

Patent Document

[Patent Document 1] Japanese Laid-Open Patent Publication No. 10-98117
[Patent Document 2] Japanese National Publication of International Patent Application No. 2016-508671

SUMMARY

According to an aspect of the embodiment, a semiconductor device includes a semiconductor substrate, a gate electrode disposed over the semiconductor substrate and extending in a first direction, a dummy gate electrode disposed over the semiconductor substrate away from the gate electrode and extending in the first direction, a first semiconductor area of a first conductive type disposed in a surface layer portion of the semiconductor substrate between the gate electrode and the dummy gate electrode, and a conductor electrically connecting the first semiconductor area with the dummy gate electrode.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENT

Figure 1A:
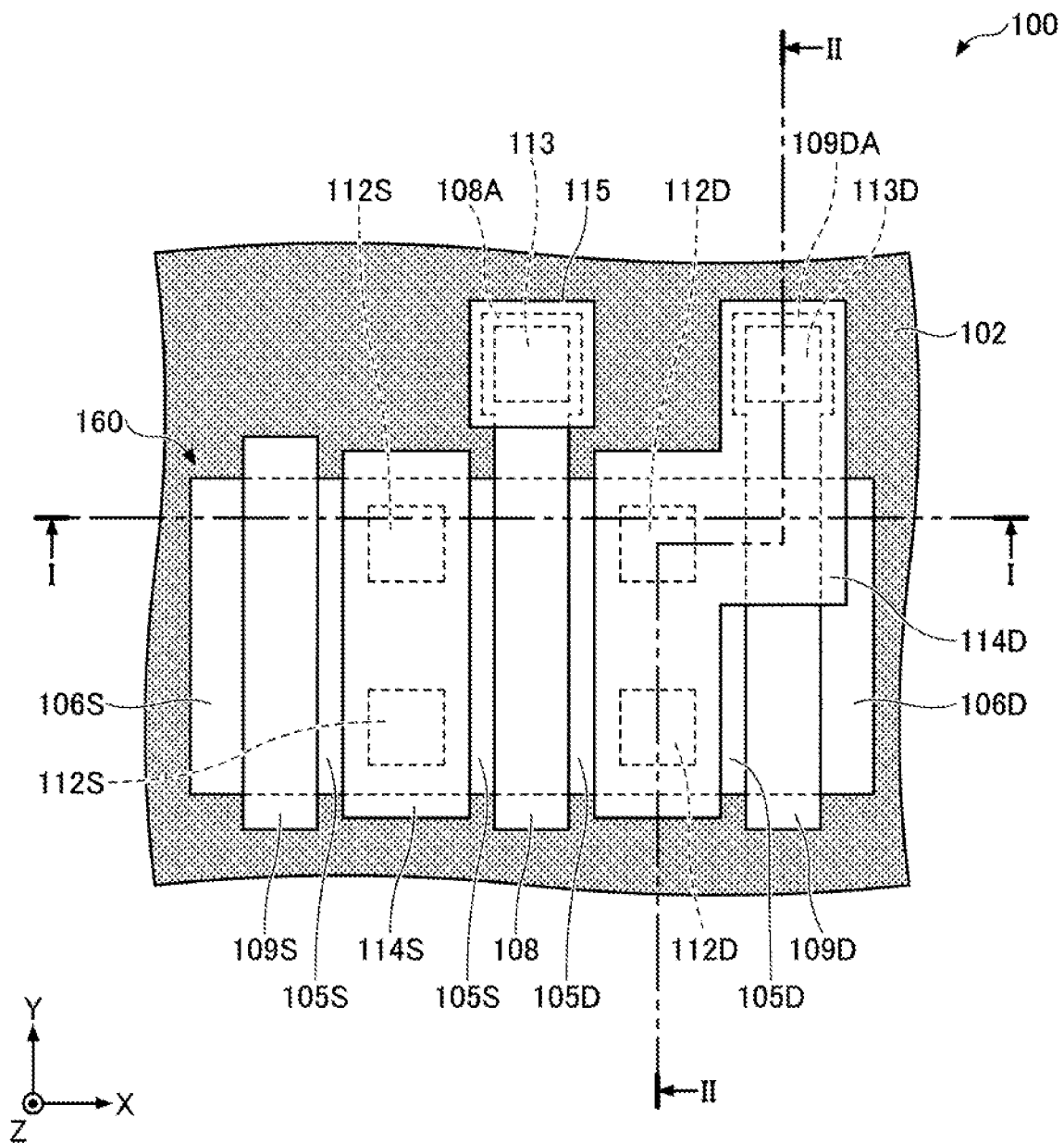
FIG. 1A is a top view illustrating a semiconductor device according to a first embodiment.

Hereinafter, embodiments of the present disclosure will be described in detail with reference to the accompanying drawings. In addition, in this specification and drawings, constituent elements having substantially the same functional configurations may be given the same reference numerals, and redundant descriptions are omitted.

First Embodiment

Figure 1B:
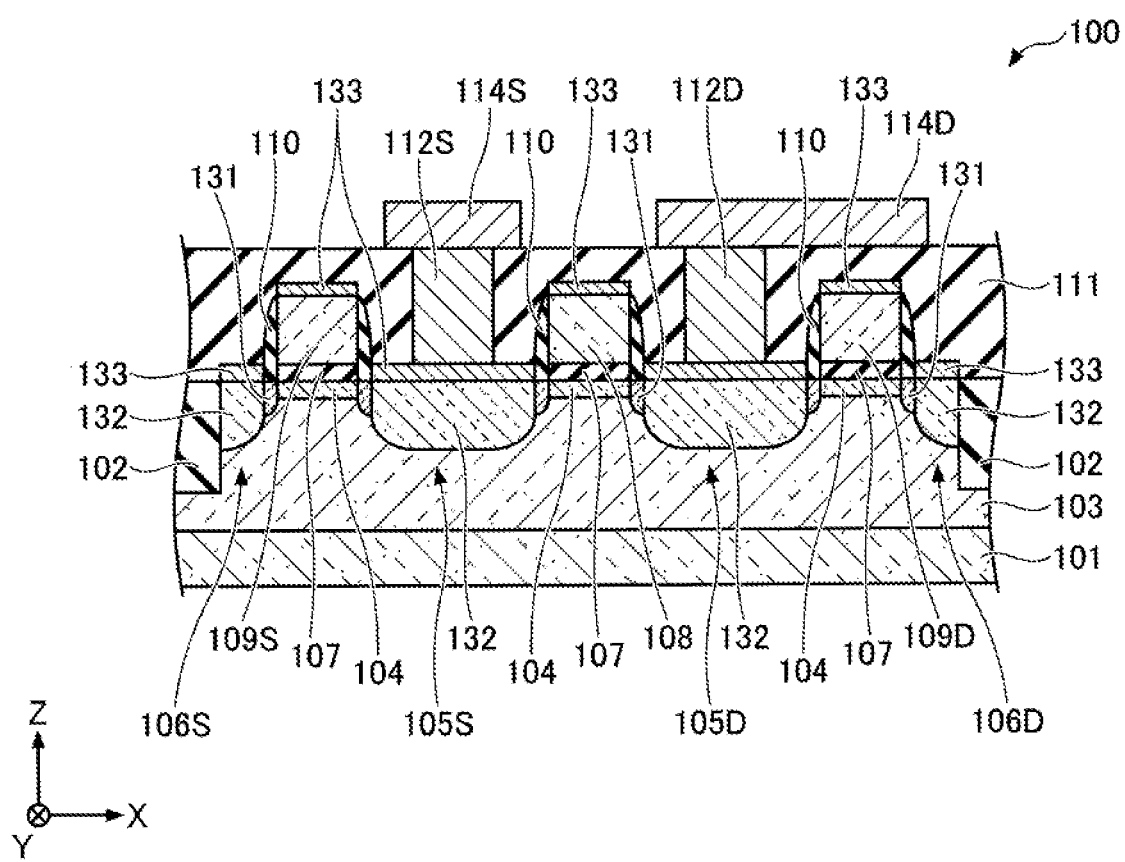
FIG. 1B is a cross-sectional view (part 1) illustrating the semiconductor device according to the first embodiment.
Figure 1C:
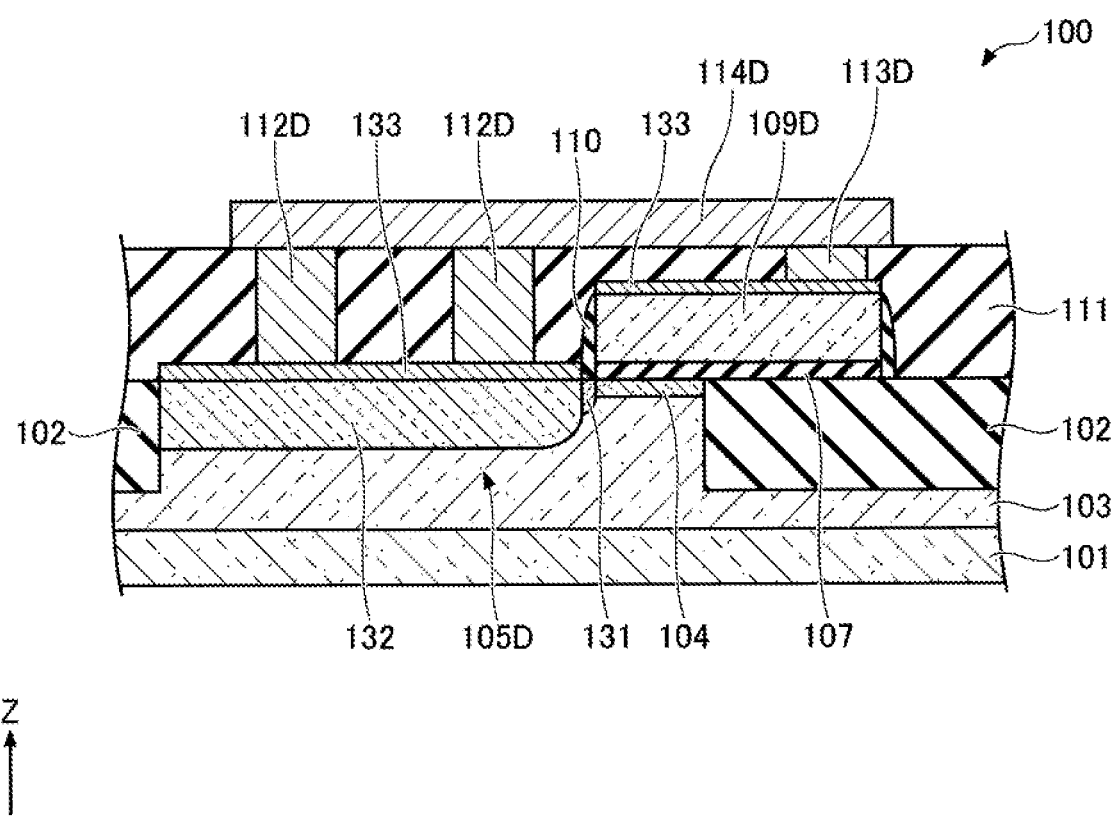
FIG. 1C is a cross-sectional view (part 2) illustrating the semiconductor device according to the first embodiment.

First, a first embodiment will be explained. FIG. 1A is a top view illustrating a semiconductor device according to the first embodiment. FIG. 1B and FIG. 1C are cross-sectional views illustrating the semiconductor device according to the first embodiment. FIG. 1A mainly illustrates a positional relationship between a device isolation insulation film, source and drain semiconductor areas, electrodes, and interconnects. FIG. 1B corresponds to a cross-sectional view taken along line I-I of FIG. 1A. FIG. 1C corresponds to a cross-sectional view taken along line II-II of FIG. 1A.

As illustrated in FIG. 1A, FIG. 1B, and FIG. 1C, in a semiconductor device 100 according to the first embodiment, a device isolation insulation film 102 defining a device active area 160 is formed in a surface layer portion of a p-type semiconductor substrate 101. The semiconductor substrate 101 is, for example, a silicon (Si) substrate. The semiconductor substrate 101 has a device active area where a p-channel type transistor is formed and a device active area where an n-channel type transistor is formed, but FIG. 1A, FIG. 1B and FIG. 1C illustrate the device active area 160 in which an n-channel type transistor is formed. For example, a planar shape of the device active area 160 is in a rectangular shape. In the following description, a direction parallel to a long side of the device active area 160 is defined as an X direction, a direction parallel to a short side is defined as a Y direction, and a thickness direction of the semiconductor substrate 101 is defined as a Z direction. The Y direction is an example of a first direction, and the X direction is an example of the second direction.

A p well 103 is formed to include the device active area 160. For example, the p well 103 contains boron (B) as a p-type impurity. For example, when the semiconductor substrate 101 is a p-type, the p well 103 can be omitted, and the semiconductor substrate 101 can also serve as a p-type area to operate as the p well 103. In that case, "p well 103" in this specification may be read as "semiconductor substrate 101" as appropriate. A gate electrode 108, a dummy gate electrode 109S, and a dummy gate electrode 109D, which extend in the Y direction, are formed over the p well 103. The gate electrode 108 is located between the dummy gate electrode 109S and the dummy gate electrode 109D in the X direction. Gate insulating films 107 are formed between the gate electrode 108 and the p well 103, between the dummy gate electrode 109S and the p well 103, and the dummy gate electrode 109D and the p well 103. For example, the thickness of the gate insulating film 107 is 1.0 nm to 10.0 nm. The thicknesses of the gate electrode 108, the dummy gate electrode 109S and the dummy gate electrode 109D are 50 nm to 200 nm. Examples of materials of the gate insulating film 107 include insulators such as silicon oxide ($SiO_2$), silicon nitride ($Si_3N_4$), and hafnium oxide ($HfO_2$). Examples of materials of the gate electrode 108, the dummy gate electrode 109S, and the dummy gate electrode 109D include polycrystalline silicon (polysilicon). Metals such as titanium (Ti) and tungsten (W) and nitrides of these metals can also be used as materials for the gate electrode 108, the dummy gate electrode 109S, and the dummy gate electrode 109D.

Both ends of the gate electrode 108 are located over the device isolation insulation film 102, and the gate electrode 108 includes an electrode pad 108A on one end of the gate electrode 108. The electrode pad 108A is wider in the X direction than a portion of the gate electrode 108 that overlaps the device active area 160 in planar view. Both ends of the dummy gate electrode 109D are located over the device isolation insulation film 102, and the dummy gate electrode 109D includes an electrode pad 109DA on an end of the same side as the electrode pad 108A. The electrode pad 109DA is wider in the X direction than a portion of the dummy gate electrode 109D that overlaps the device active area 160 in planar view. Both ends of the dummy gate electrode 109S are located over the device isolation insulation film 102. In the present embodiment, the electrode pad 108A and the electrode pad 109DA are arranged to be side by side in the X direction, and the distance between the electrode pad 109DA and the device active area 160 is equal to the distance between the electrode pad 108A and the device active area 160 in the Y direction. The electrode pad 108A is an example of a first electrode pad and the electrode pad 109DA is an example of a second electrode pad.

Spacers (sidewalls) 110 of an insulating film are formed on both sides of the gate electrode 108, the dummy gate electrode 109S, and the dummy gate electrode 109D in the X direction. In the surface layer portion of the p well 103, an n-type semiconductor area 131 is formed under the spacer 110 at a first depth, and n-type semiconductor areas 132 are formed, at a second depth deeper than the first depth, in portions exposed from the spacer 110, the gate electrode 108, the dummy gate electrode 109S, and the dummy gate electrode 109D. For example, the n-type semiconductor area 131 contains phosphorus (P) as an n-type impurity at a first impurity concentration and the n-type semiconductor area 132 contains phosphorus as an n-type impurity at a second impurity concentration higher than the first impurity concentration. Among the n-type semiconductor areas 131 and 132, those located between the gate electrode 108 and the dummy gate electrode 109S are included in an n-type semiconductor area 105S, and those located between the gate electrode 108 and the dummy gate electrode 109D are included in an n-type semiconductor area 105D. Among the n-type semiconductor areas 131 and 132, those located between the dummy gate electrode 109S and the device isolation insulation film 102 are included in an n-type semiconductor area 106S, and those located between the dummy gate electrode 109D and the device isolation insulation film 102 are included in an n-type semiconductor area 106D. The n-type semiconductor area 105D is an example of a first semiconductor area.

Below the gate electrode 108, the dummy gate electrode 109S, and the dummy gate electrode 109D, a p-type semiconductor area 104 is formed in the surface layer portion of the p well 103 between the n-type semiconductor areas 131. The p-type semiconductor area 104 contains, for example, boron as a p-type impurity.

For example, the dummy gate electrode 109S and the dummy gate electrode 109D are disposed alongside the gate electrode 108 and extend at least an entire portion over the p-type semiconductor area 104. For example, in the X direction, the distance between the gate electrode 108 and the dummy gate electrode 109S, and the distance between the gate electrode 108 and the dummy gate electrode 109D are constant throughout a portion of the gate electrode 108 over the p-type semiconductor area 104. The distance between the gate electrode 108 and the dummy gate electrode 109S may be the same as or may be different from the distance between the gate electrode 108 and the dummy gate electrode 109D.

A silicide layer 133 is formed on the n-type semiconductor area 132. The silicide layers 133 are also formed on the gate electrode 108, the dummy gate electrode 109S, and the dummy gate electrode 109D. The silicide layer 133 is a silicide layer of, for example, cobalt (Co), nickel (Ni), tungsten (W), or titanium (Ti).

An interlayer insulating film 111 is formed over the semiconductor substrate 101 so as to cover the spacers 110 and the silicide layers 133. In the interlayer insulating film 111, a contact hole reaching the silicide layer 133 over the n-type semiconductor area 105S and a contact hole reaching the silicide layer 133 over the n-type semiconductor area 105D are formed. In the interlayer insulating film 111, a contact hole reaching the silicide layer 133 on the electrode pad 108A and a contact hole reaching the silicide layer 133 on the electrode pad 109DA are formed. A conductive plug 112S is embedded in the contact hole reaching the silicide layer 133 over the n-type semiconductor area 105S. A conductive plug 112D is embedded in the contact hole reaching the silicide layer 133 over the n-type semiconductor area 105D. A conductive plug 113 is embedded in the contact hole reaching the silicide layer 133 on the electrode pad 108A. A conductive plug 113D is embedded in the contact hole reaching the silicide layer 133 on the electrode pad 109DA. The conductive plugs 112S, 112D, 113, and 113D are, for example, tungsten plugs. An interconnect 114S connected to the conductive plug 112S and an interconnect 115 connected to the conductive plug 113 are formed on the interlayer insulating film 111. An interconnect 114D connected to the conductive plug 112D and the conductive plug 113D is formed on the interlayer insulating film 111. That is, the dummy gate electrode 109D and the n-type semiconductor area 105D are electrically connected through the interconnect 114D. The interconnect 114D is an example of a conductor.

For example, a signal is applied to the gate electrode 108 through the interconnect 115. To the interconnect 114D, a drain voltage of the transistor including the gate electrode 108 is applied, and to the interconnect 114S, a source voltage of the transistor including the gate electrode 108 is applied with. For example, the potential of the n-type semiconductor areas 106S and 106D is floating.

In the semiconductor device 100 according to the first embodiment, as described above, the dummy gate electrode 109D and the n-type semiconductor area 105D are electrically connected through the interconnect 114D. Thus, the potential of the dummy gate electrode 109D is equal to the potential of the n-type semiconductor area 105D, and an inversion layer is formed in the p-type semiconductor area 104 under the dummy gate electrode 109D. Therefore, an electric field of the pn junction under the dummy gate electrode 109D can be more moderate than an electric field of the pn junction under the gate electrode 108, and a junction leakage current can be suppressed.

For example, a drain voltage is 0.5 V and a source voltage is 0 V, and a bias voltage of −0.5 V is applied to the p well 103 through the semiconductor substrate 101. In this state, a junction leakage current can be suppressed when a voltage of the gate electrode 108 is 0 V. By applying a negative bias voltage, a subthreshold leakage current between the source and the drain can be reduced.

Next, a manufacturing method for manufacturing the semiconductor device 100 according to the first embodiment will be described. FIG. 2A to FIG. 2E are cross-sectional views illustrating the manufacturing method for manufacturing the semiconductor device according to the first embodiment. FIG. 2A to FIG. 2E illustrate parts corresponding to the cross-sectional views taken along line I-I of FIG. 1A.

Figure 2A:
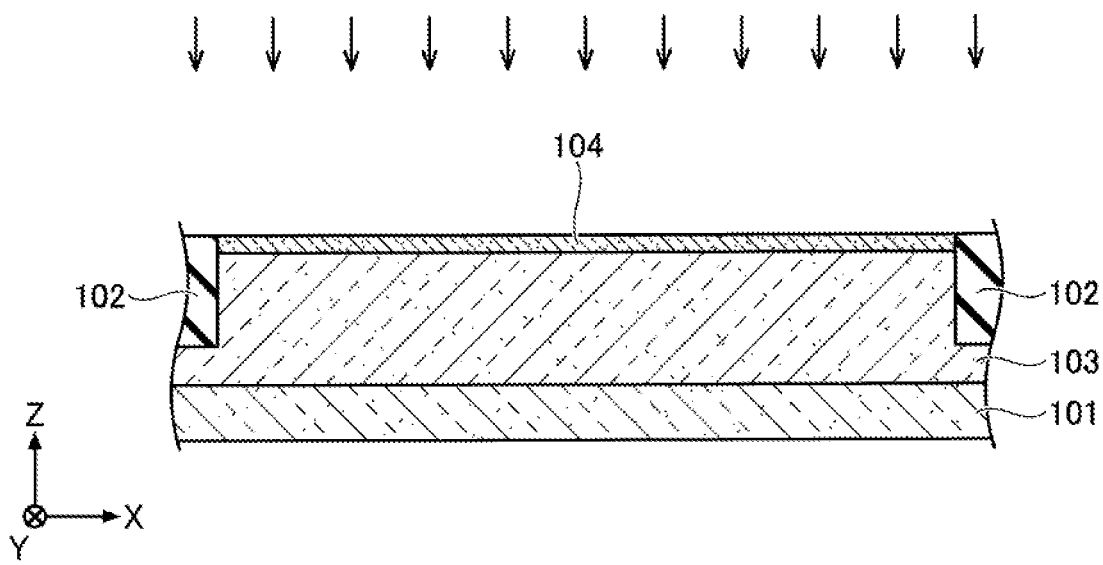
FIG. 2A is a cross-sectional view (part 1) illustrating a manufacturing method for manufacturing the semiconductor device according to the first embodiment.

First, as illustrated in FIG. 2A, the device isolation insulation film 102 that defines a device active area 160 is formed in the surface layer portion of the semiconductor substrate 101. The device isolation insulation film 102 can be formed by, for example, an STI (shallow trench isolation) method. Next, the p well 103 is formed so as to include the device active area 160. For example, the p well 103 can be formed by forming a mask of photoresist (which is not illustrated) having an opening so as to include the device active area 160 over the semiconductor substrate 101, and performing ion-implantation of a p-type impurity using the mask. For example, boron is ion-implanted as the p-type impurity at an energy of 100 keV to 300 keV and a dose of $1.0 \times 10^{13}$ cm$^{-2}$ to $3.0 \times 10^{14}$ cm$^{-2}$. The mask is removed after the ion implantation of the p-type impurity. Here, for example, when the semiconductor substrate 101 is a p-type and has a desired concentration, forming the p well 103 can be omitted, and the semiconductor substrate 101 can also serve as a p-type area to operate as the p well 103. In that case, "p well 103" in this specification may be read as "semiconductor substrate 101" as appropriate.

As also illustrated in FIG. 2A, the p-type semiconductor area 104 is formed in the surface layer portion of the p well 103. The p-type semiconductor area 104 can, for example, be formed by forming a mask of photoresist (which is not illustrated) having an opening so as to include the p well 103 over the semiconductor substrate 101, and performing ion-implantation of a p-type impurity using the mask. For example, boron is ion-implanted as the p-type impurity at an energy of 0.3 keV to 20 keV and a dose of $1.0 \times 10^{12}$ cm$^{-2}$ to $1.0 \times 10^{14}$ cm$^{-2}$. The mask is removed after the ion implantation of the p-type impurity.

Figure 2B:
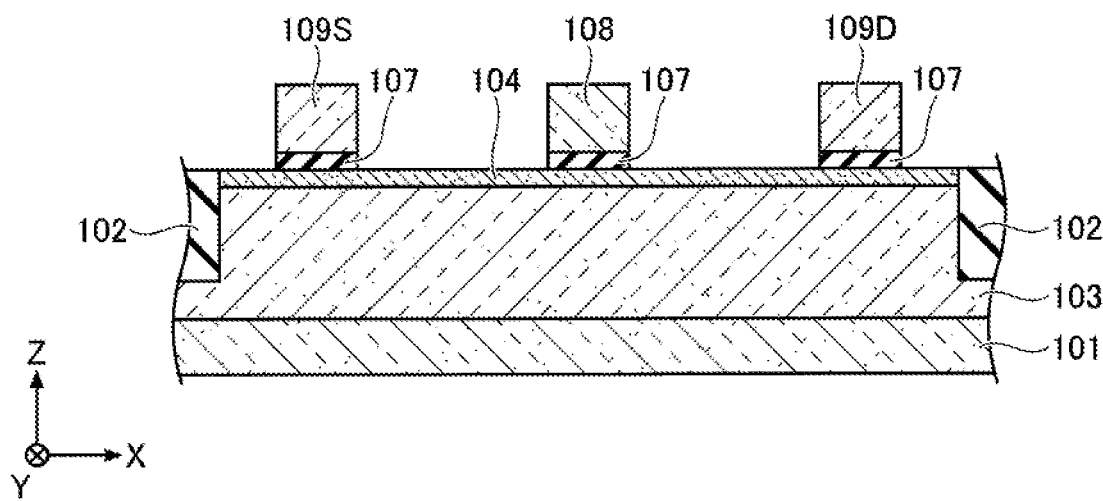
FIG. 2B is a cross-sectional view (part 2) illustrating the manufacturing method for manufacturing the semiconductor device according to the first embodiment.

Next, as illustrated in FIG. 2B, the gate insulating film 107, the gate electrode 108, the dummy gate electrode 109S, and the dummy gate electrode 109D are formed. For example, an insulating film and a polysilicon film are formed over the semiconductor substrate 101, and these are processed by photolithography and etching. This can form the gate insulating film 107, the gate electrode 108, the dummy gate electrode 109S, and the dummy gate electrode 109D. In the photolithography, the exposure and development of a photoresist are performed using a single exposure mask on which a pattern for the gate electrode 108, a pattern for the dummy gate electrode 109S, and a pattern for the dummy gate electrode 109D are formed. The pattern for the gate electrode 108 includes a pattern for the electrode pad 108A, and the pattern for the dummy gate electrode 109D includes a pattern for the electrode pad 109DA.

Figure 2C:
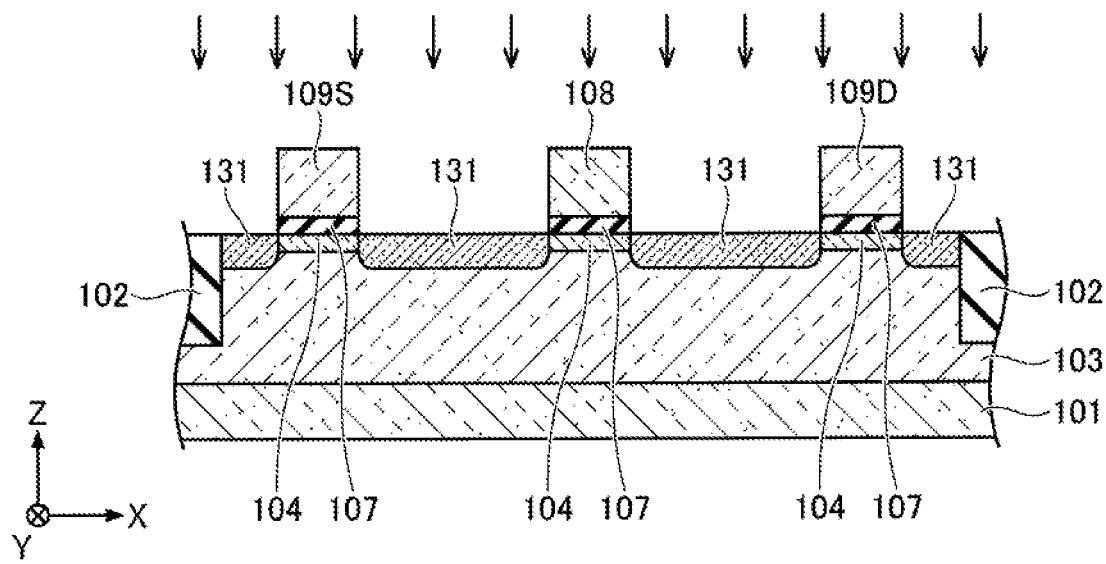
FIG. 2C is a cross-sectional view (part 3) illustrating the manufacturing method for manufacturing the semiconductor device according to the first embodiment.

Next, as illustrated in FIG. 2C, in the device active area 160, the n-type semiconductor area 131 having the first impurity concentration is formed by performing ion-implantation of an n-type impurity using the gate electrode 108, the dummy gate electrode 109S, and the dummy gate electrode 109D as a mask. For example, phosphorus is ion-implanted as the n-type impurity at an energy of 5 keV to 20 keV and a dose of $1.0 \times 10^{13}$ cm$^{-2}$ to $1.0 \times 10^{15}$ cm$^{-2}$.

Figure 2D:
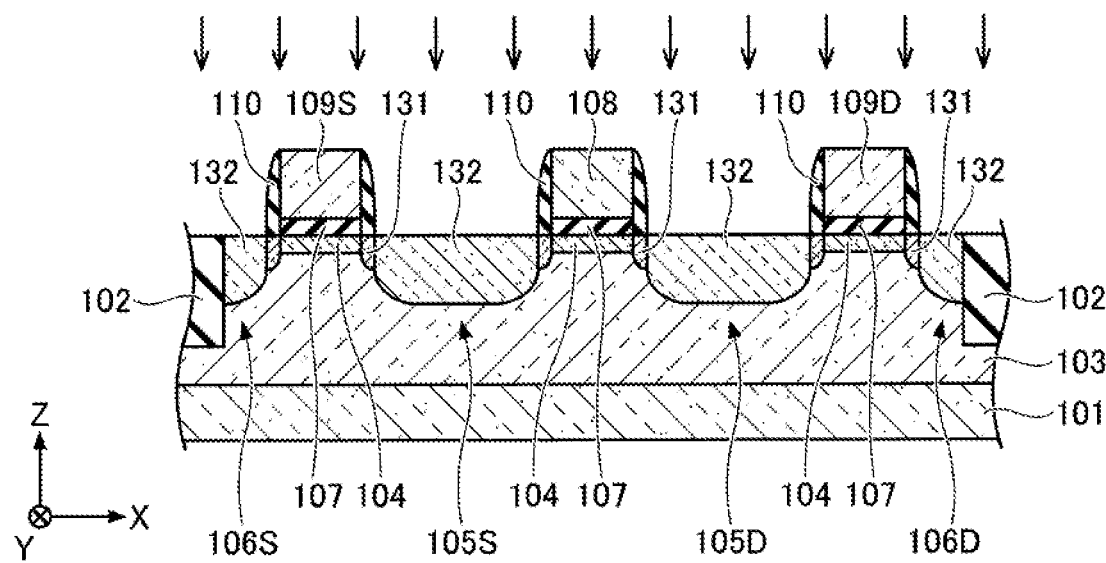
FIG. 2D is a cross-sectional view (part 4) illustrating the manufacturing method for manufacturing the semiconductor device according to the first embodiment.

Subsequently, as illustrated in FIG. 2D, spacers 110 of an insulating film are formed on both sides of the gate electrode 108, the dummy gate electrode 109S, and the dummy gate electrode 109D. Next, in the device active area 160, the n-type semiconductor area 132 having the second impurity concentration higher than the first impurity concentration is formed to be deeper than the n-type semiconductor area 131 by performing ion-implantation of an n-type impurity using the spacers 110, the gate electrode 108, the dummy gate electrode 109S, and the dummy gate electrode 109D as a mask. For example, phosphorus is ion-implanted as the n-type impurity at an energy of 5 keV to 30 keV and a dose of $1.0 \times 10^{15}$ cm$^{-2}$ to $3.0 \times 10^{16}$ cm$^{-2}$. In planar view, the n-type semiconductor areas 131 and 132 located between the gate electrode 108 and the dummy gate electrode 109S constitute the n-type semiconductor area 105S, and the n-type semiconductor areas 131 and 132 located between the gate electrode 108 and the dummy gate electrode 109D constitute the n-type semiconductor area 105D. In planar view, the n-type semiconductor areas 131 and 132 located on a dummy gate electrode 109S side opposite to the gate electrode 108 constitute the n-type semiconductor area 106S, and the n-type semiconductor areas 131 and 132 located on a dummy gate electrode 109D side opposite to the gate electrode 108 constitute the n-type semiconductor area 106D.

Figure 2E:
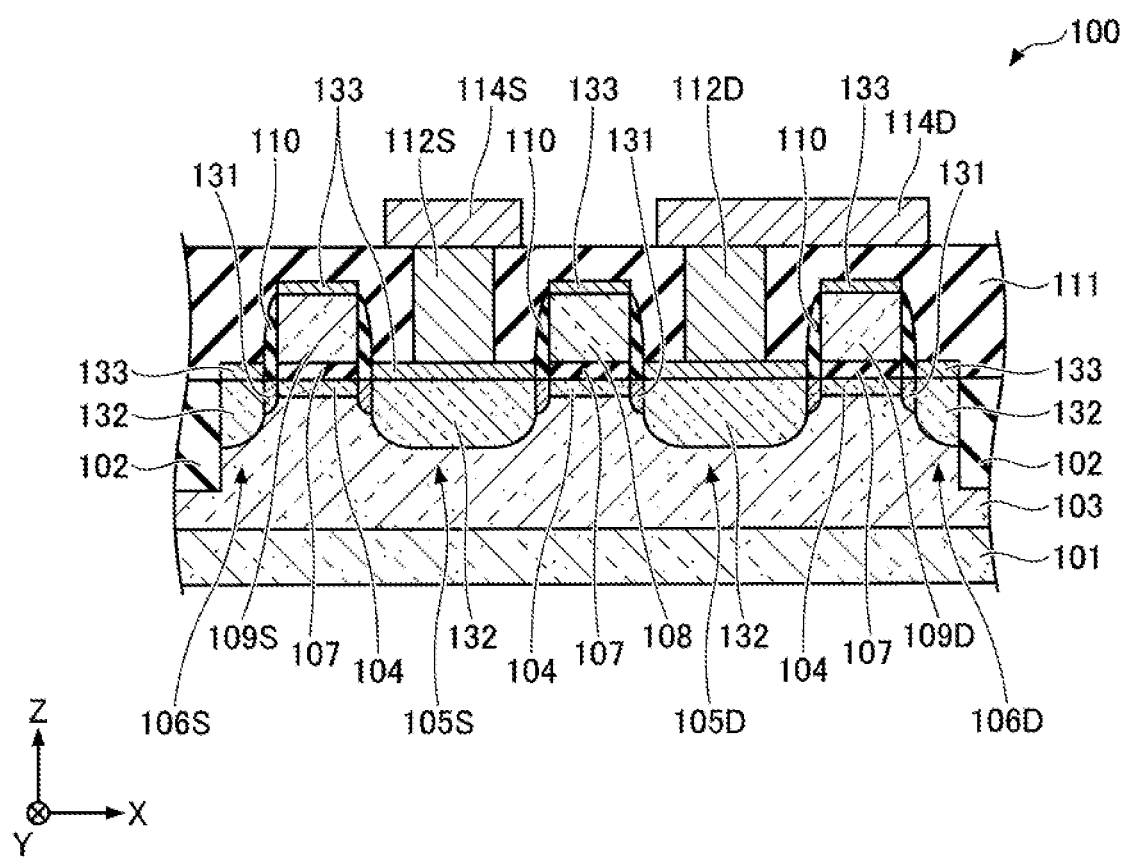
FIG. 2E is a cross-sectional view (part 5) illustrating the manufacturing method for manufacturing the semiconductor device according to the first embodiment.

Next, as illustrated in FIG. 2E, the silicide layers 133 are formed on the n-type semiconductor area 132, the gate electrode 108, the dummy gate electrode 109S, and the dummy gate electrode 109D. Subsequently, the interlayer insulating film 111 is formed over the semiconductor substrate 101, and the surface of the interlayer insulating film 111 is smoothed by a chemical mechanical polishing (CMP) method or the like. Next, a contact hole reaching the silicide layer 133 over the n-type semiconductor area 105S and a contact hole reaching the silicide layer 133 over the n-type semiconductor area 105D, a contact hole reaching the silicide layer 133 on the electrode pad 108A, and a contact hole reaching the silicide layer 133 on the electrode pad 109DA are formed in the interlayer insulating film 111. Conductive films are formed in these contact holes. As a result, the conductive plug 112S connected to the silicide layer 133 over the n-type semiconductor area 105S, the conductive plug 112D connected to the silicide layer 133 over the n-type semiconductor area 105D, the conductive plug 113 (see FIG. 1A) connected to the silicide layer 133 on the electrode pad 108A, and the conductive plug 113D (see FIG. 1A and FIG. 1C) connected to the silicide layer 133 on the electrode pad 109DA are formed. Next, the interconnect 114S connected to the conductive plug 112S, the interconnect 115 connected to the conductive plug 113, and interconnect 114D connected to the conductive plug 112D and the conductive plug 113D are formed on the interlayer insulating film 111.

The semiconductor device 100 is completed by forming an interconnect or the like on an upper layer as needed.

In this manufacturing method, in the photolithography for forming the gate electrode 108, the dummy gate electrode 109S, and the dummy gate electrode 109D, the photoresist is exposed and developed using a single exposure mask on which the pattern for the gate electrode 108, the pattern for the dummy gate electrode 109S, and the pattern for the dummy gate electrode 109D are formed. Thus, even when the gate electrode 108 of an actually-operated transistor is formed in an area where the pattern density is low, the pattern density is supplemented by the pattern for the dummy gate electrode 109S and the pattern for the dummy gate electrode 109D, which can increase the pattern density uniformity of the exposure mask. Therefore, the processing accuracy of the gate electrode 108 is less affected by the pattern density.

Second Embodiment

Figure 3:
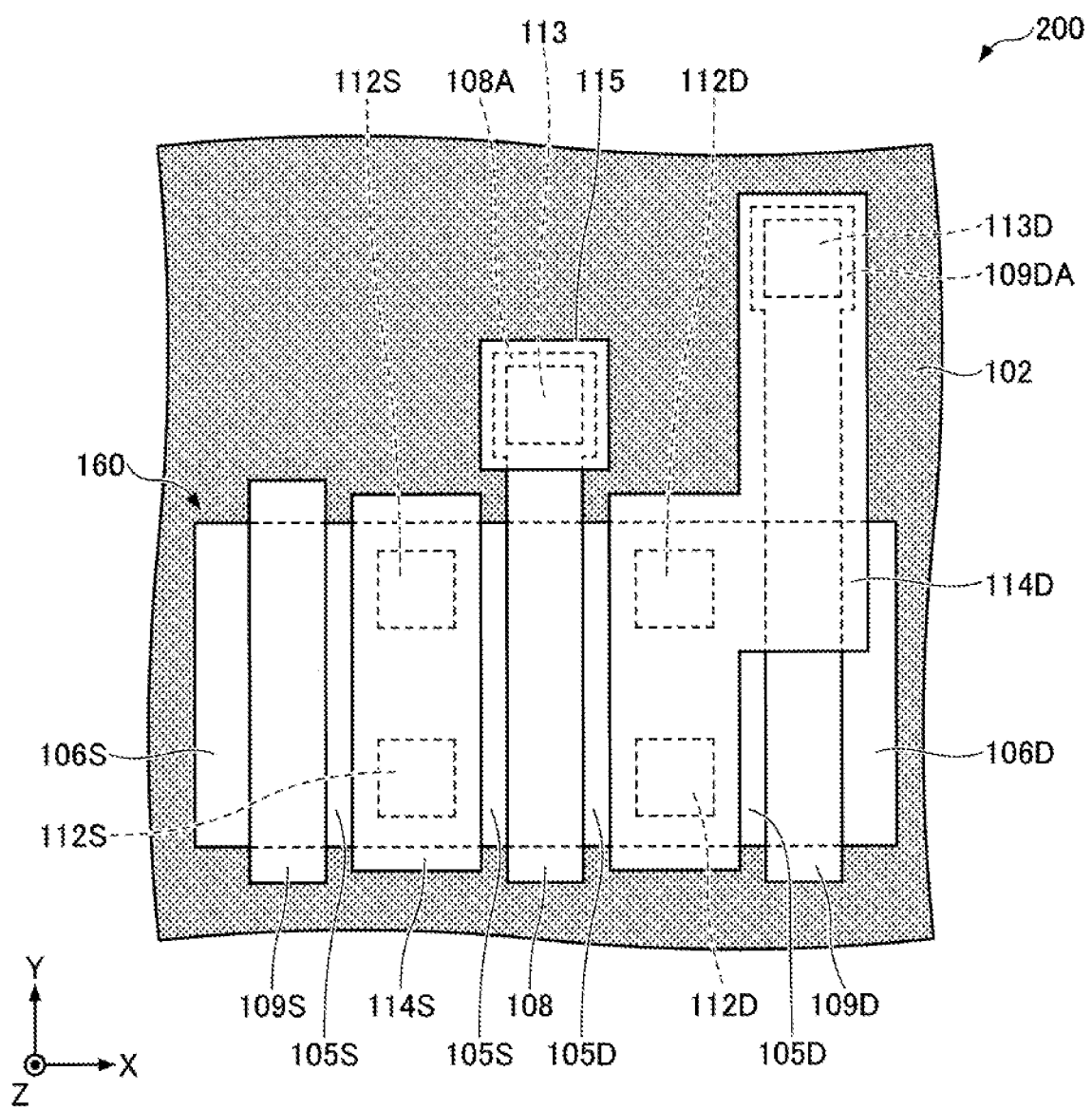
FIG. 3 is a top view illustrating a semiconductor device according to a second embodiment.

Next, a second embodiment will be described. FIG. 3 is a top view illustrating a semiconductor device according to the second embodiment.

In a semiconductor device 200 according to the second embodiment, as illustrated in FIG. 3, the dummy gate electrode 109D is longer than the gate electrode 108. In the Y direction, the electrode pad 109DA is disposed further away from the device active area 160 than the electrode pad 108A. Other configurations are similar to the configuration of the first embodiment.

In the semiconductor device 200 according to the second embodiment, the distance between the electrode pad 108A and electrode pad 109DA can be longer than the distance between the electrode pad 108A and electrode pad 109DA in the semiconductor device 100. Thus, in the X direction, even if the distance between the gate electrode 108 and the dummy gate electrode 109D is narrowed, insulation between the electrode pad 108A and the electrode pad 109DA is easily obtained.

When the semiconductor device 200 according to the second embodiment is manufactured, in the photolithography for forming the gate electrode 108, the dummy gate electrode 109S, and the dummy gate electrode 109D, the exposure and development of a photoresist are performed using a single exposure mask on which the pattern for the gate electrode 108, the pattern for the dummy gate electrode 109S, and the pattern for the dummy gate electrode 109D are formed. Thus, in a manner similar to the first embodiment, the processing accuracy of the gate electrode 108 is less affected by the pattern density.

Third Embodiment

Figure 4:
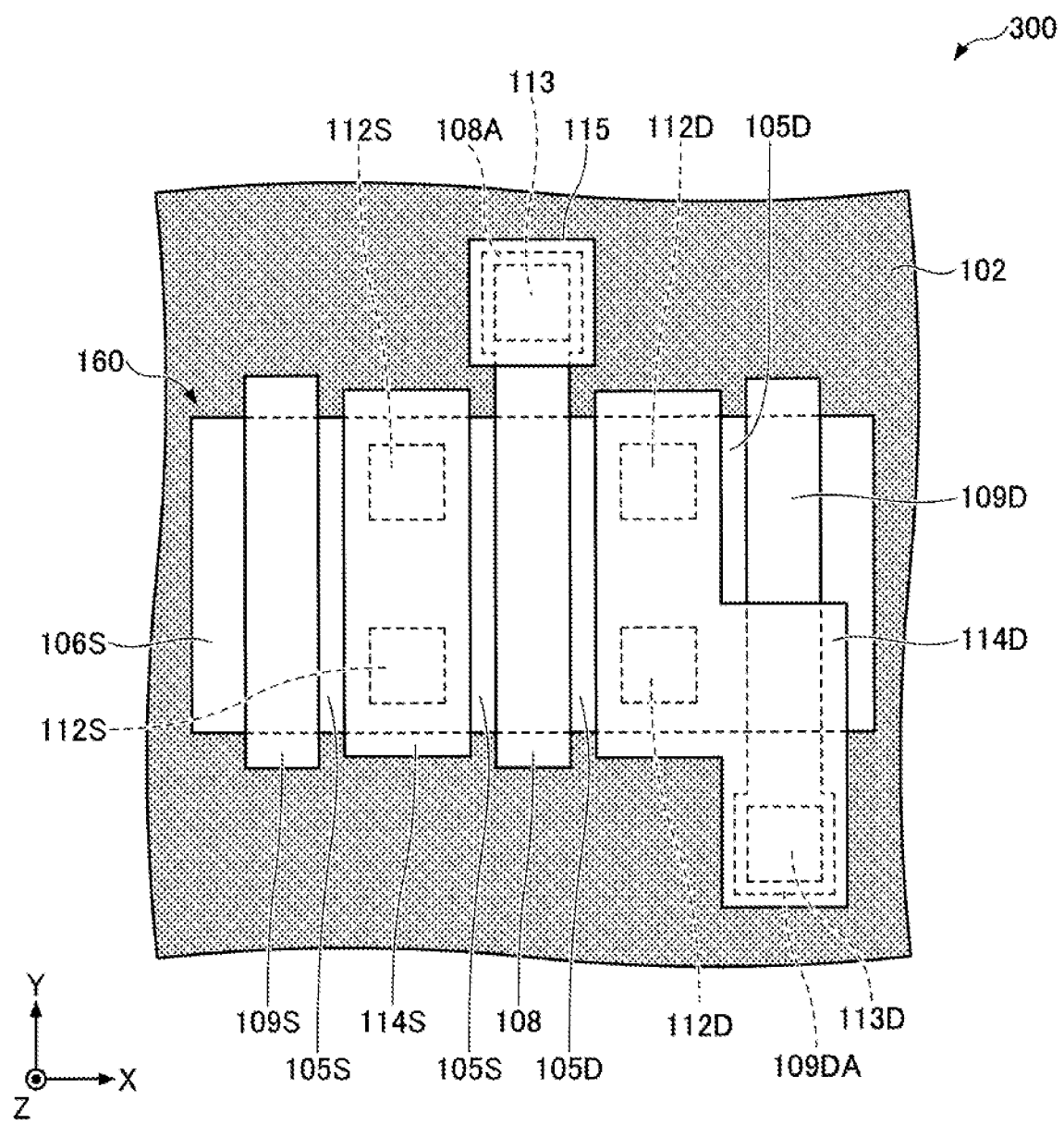
FIG. 4 is a top view illustrating a semiconductor device according to a third embodiment.

Next, a third embodiment will be described. FIG. 4 is a top view illustrating a semiconductor device according to the third embodiment.

In a semiconductor device 300 according to the third embodiment, as illustrated in FIG. 4, the dummy gate electrode 109D includes the electrode pad 109DA on an end opposite to the electrode pad 108A. Other configurations are similar to the configuration of the first embodiment.

In the semiconductor device 300 according to the third embodiment, the distance between the electrode pad 108A and electrode pad 109DA can be longer than the distance between the electrode pad 108A and electrode pad 109DA in the semiconductor device 100. Thus, in the X direction, even if the distance between the gate electrode 108 and the dummy gate electrode 109D is narrowed, insulation between the electrode pad 108A and the electrode pad 109DA is easily obtained.

When the semiconductor device 300 according to the third embodiment is manufactured, in the photolithography for forming the gate electrode 108, the dummy gate electrode 109S, and the dummy gate electrode 109D, the exposure and development of a photoresist are performed using a single exposure mask on which the pattern for the gate electrode 108, the pattern for the dummy gate electrode 109S, and the pattern for the dummy gate electrode 109D are formed. Thus, in a manner similar to the first embodiment, the processing accuracy of the gate electrode 108 is less affected by the pattern density.

Fourth Embodiment

Figure 5A:
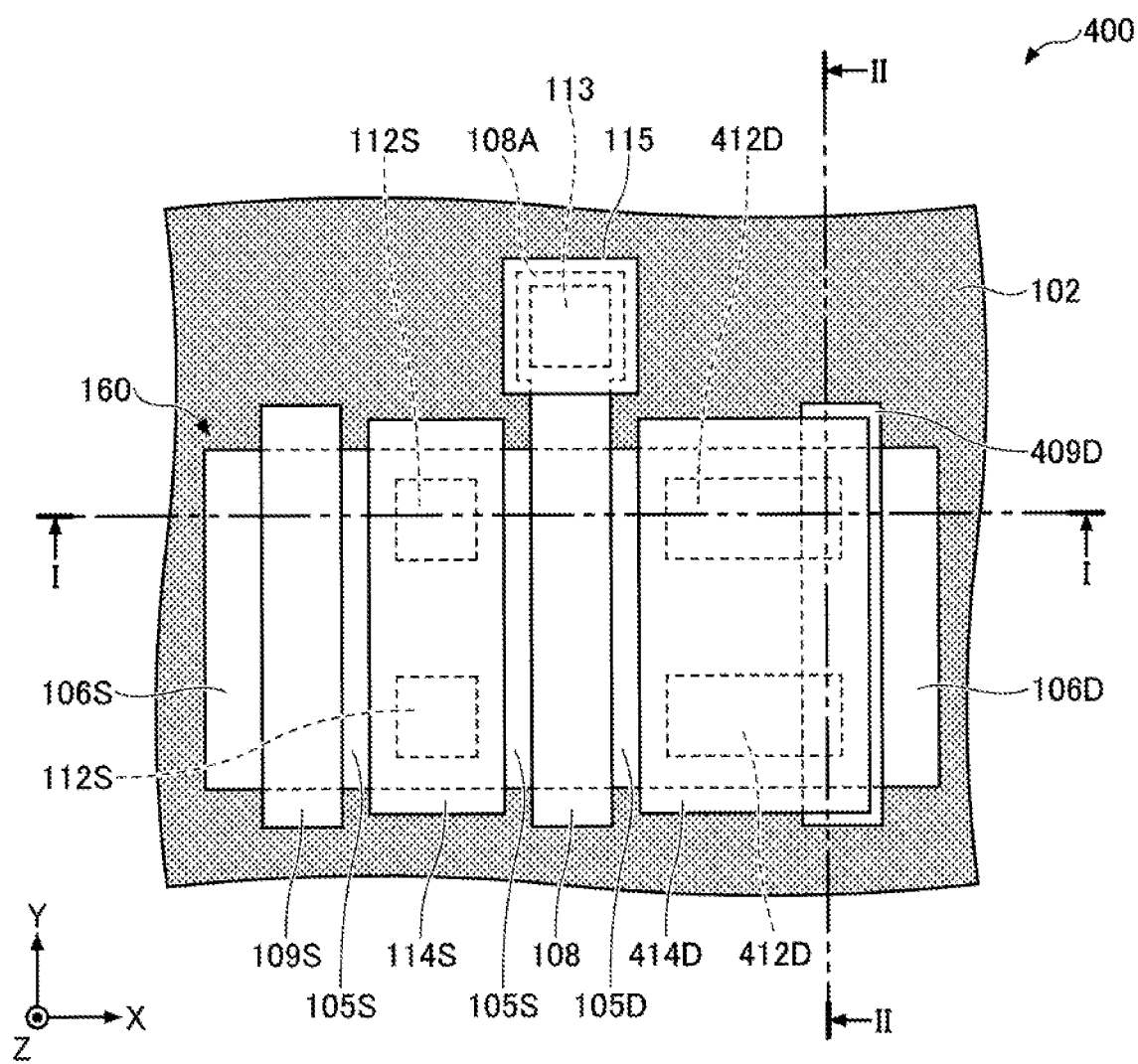
FIG. 5A is a top view illustrating a semiconductor device according to a fourth embodiment.
Figure 5B:
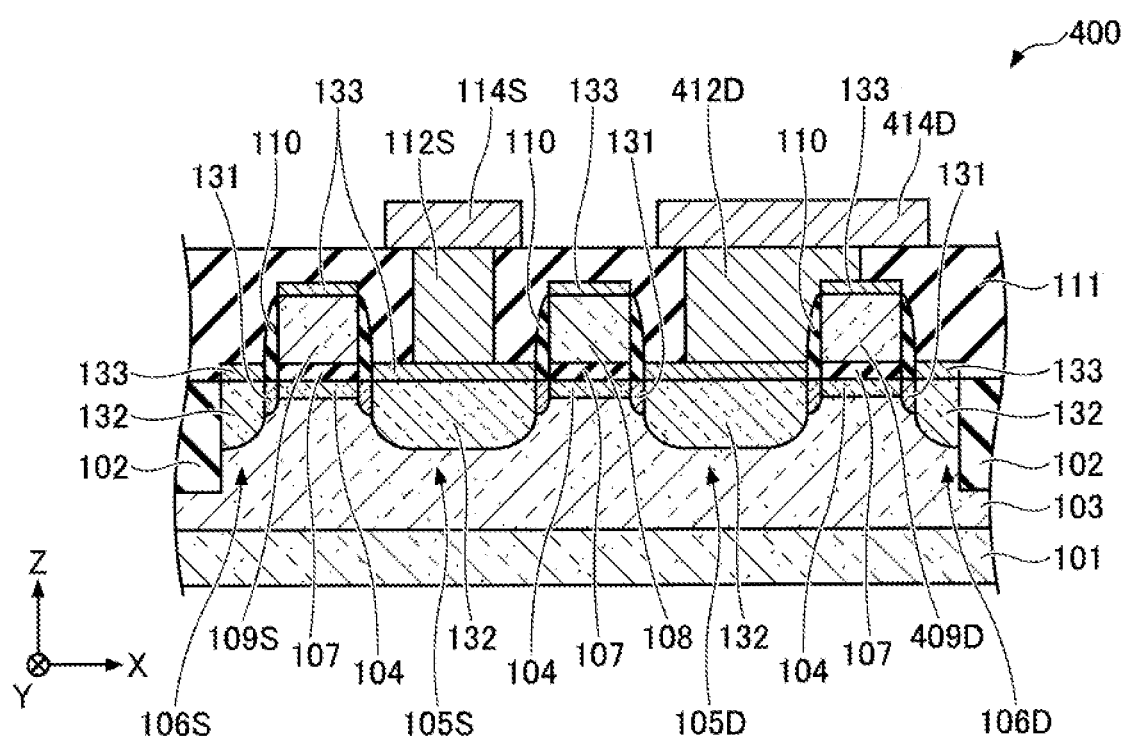
FIG. 5B is a cross-sectional view (part 1) illustrating the semiconductor device according to the fourth embodiment.
Figure 5C:
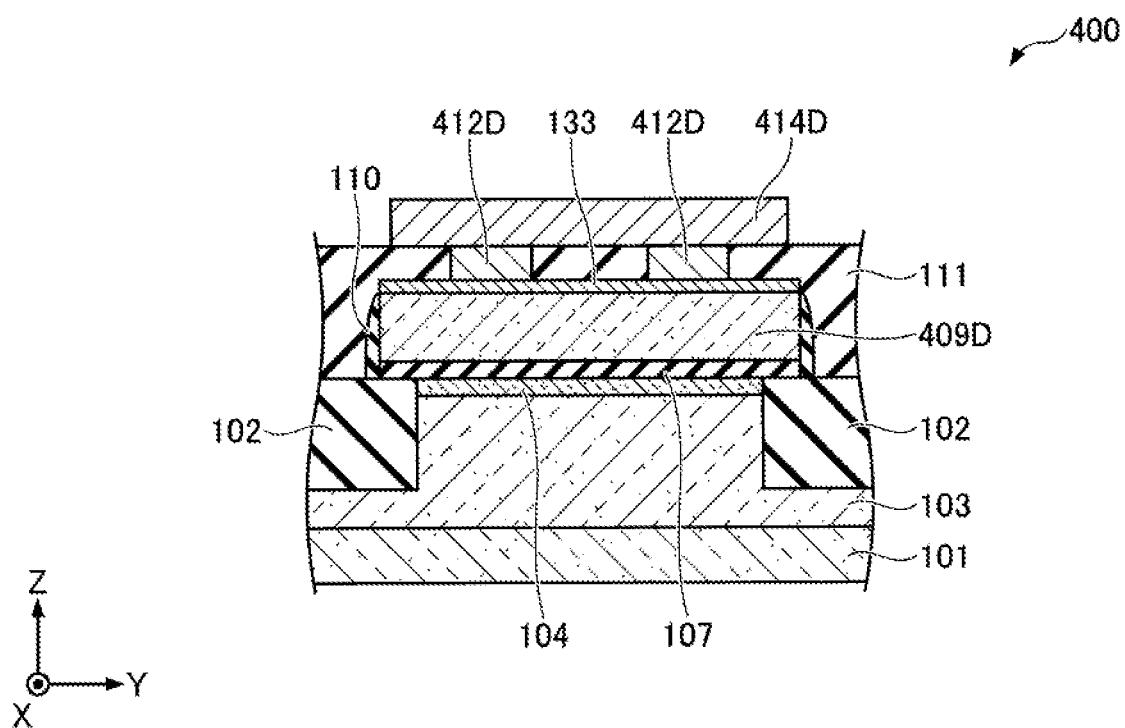
FIG. 5C is a cross-sectional view (part 2) illustrating the semiconductor device according to the fourth embodiment.

Next a fourth embodiment will be described. FIG. 5A is a top view illustrating a semiconductor device according to the fourth embodiment, and FIG. 5B and FIG. 5C are cross-sectional views illustrating the semiconductor device according to the fourth embodiment. FIG. 5A mainly illustrates a positional relationship between a device isolation insulation film, source and drain semiconductor areas, electrodes, and interconnects. FIG. 5B corresponds to a cross-sectional view taken along line I-I of FIG. 5A. FIG. 5C corresponds to a cross-sectional view taken along line II-II of FIG. 5A.

As illustrated in FIG. 5A, FIG. 5B, and FIG. 5C, in a semiconductor device 400 according to the fourth embodiment, a dummy gate electrode 409D is provided instead of the dummy gate electrode 109D. In a manner similar to the dummy gate electrode 109S, both ends of the dummy gate electrode 409D are located over the device isolation insulation film 102, but the dummy gate electrode 409D does not include an electrode pad and the size in the X direction is constant.

In the semiconductor device 400, a contact hole reaching the silicide layer 133 over the n-type semiconductor area 105D is formed so as to reach the silicide layer 133 on the dummy gate electrode 409D. A conductive plug 412D is embedded in the contact hole. In planar view in parallel with the substrate, one side (in the X direction) of the conductive plug 412D is longer than the other side (in the Y direction), and the conductive plug 412D has a structure of what is called a shared contact. The conductive plug 412D is formed with continuously contacting the silicide layer 133 that is an upper layer of the n-type semiconductor area 105D that is the first semiconductor area and the silicide layer 133 that is an upper layer of the dummy gate electrode 409D. An interconnect 414D is provided instead of the interconnect 114D. The interconnect 414D is connected to the conductive plug 412D. That is, the dummy gate electrode 409D and the n-type semiconductor area 105D are electrically connected through the interconnect 414D. Other configurations are similar to the configuration of the first embodiment. The interlayer insulating film 111 is an example of an insulating film and the conductive plug 412D is an example of a conductive plug.

In the semiconductor device 400 according to the fourth embodiment, the potential of the dummy gate electrode 409D is equal to the potential of the n-type semiconductor area 105D, and an inversion layer is formed in the p-type semiconductor area 104 under the dummy gate electrode 409D. Therefore, an electric field of the pn junction under the dummy gate electrode 409D can be more moderate than an electric field of the pn junction under the gate electrode 108, and a junction leakage current can be suppressed.

Since an electrode pad is not provided on the dummy gate electrode 409D, even if the distance between the gate electrode 108 and the dummy gate electrode 409D is narrowed in the X direction, insulation between the gate electrode 108 and the dummy gate electrode 409D is easily obtained. Additionally, since an electrode pad is not provided on the dummy gate electrode 409D, an area can be reduced compared with the second embodiment and third embodiment. Thus, according to the fourth embodiment, area saving can be achieved with obtaining insulation.

When the semiconductor device 400 according to the fourth embodiment is manufactured, in the photolithography for forming the gate electrode 108, the dummy gate electrode 109S, and the dummy gate electrode 409D, the exposure and development of a photoresist are performed using a single exposure mask on which the pattern for the gate electrode 108, the pattern for the dummy gate electrode 109S, and a pattern for the dummy gate electrode 409D are formed. Thus, in a manner similar to the first embodiment, the processing accuracy of the gate electrode 108 is less affected by the pattern density.

Fifth Embodiment

Figure 6A:
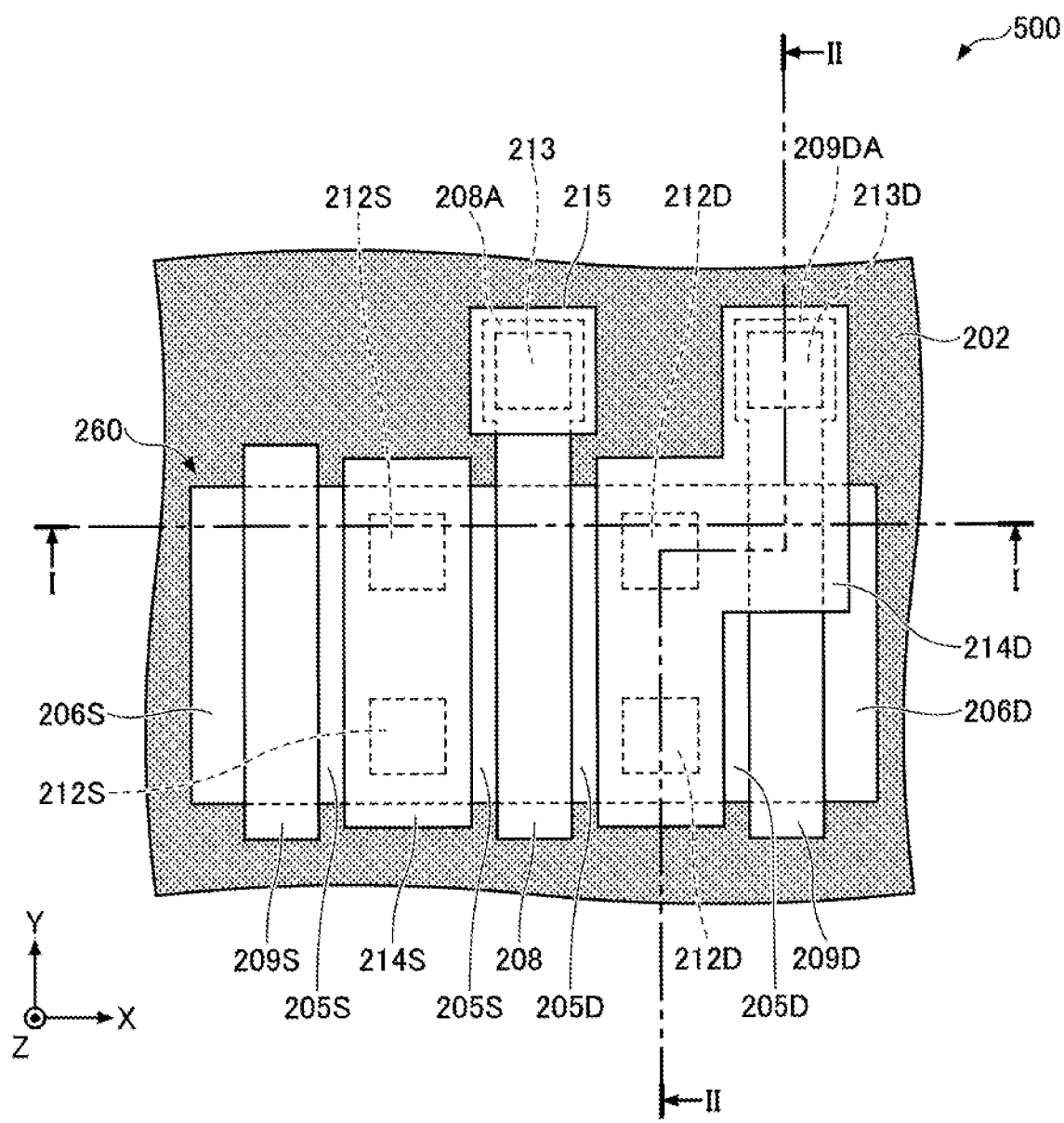
FIG. 6A is a top view illustrating a semiconductor device according to a fifth embodiment.
Figure 6B:
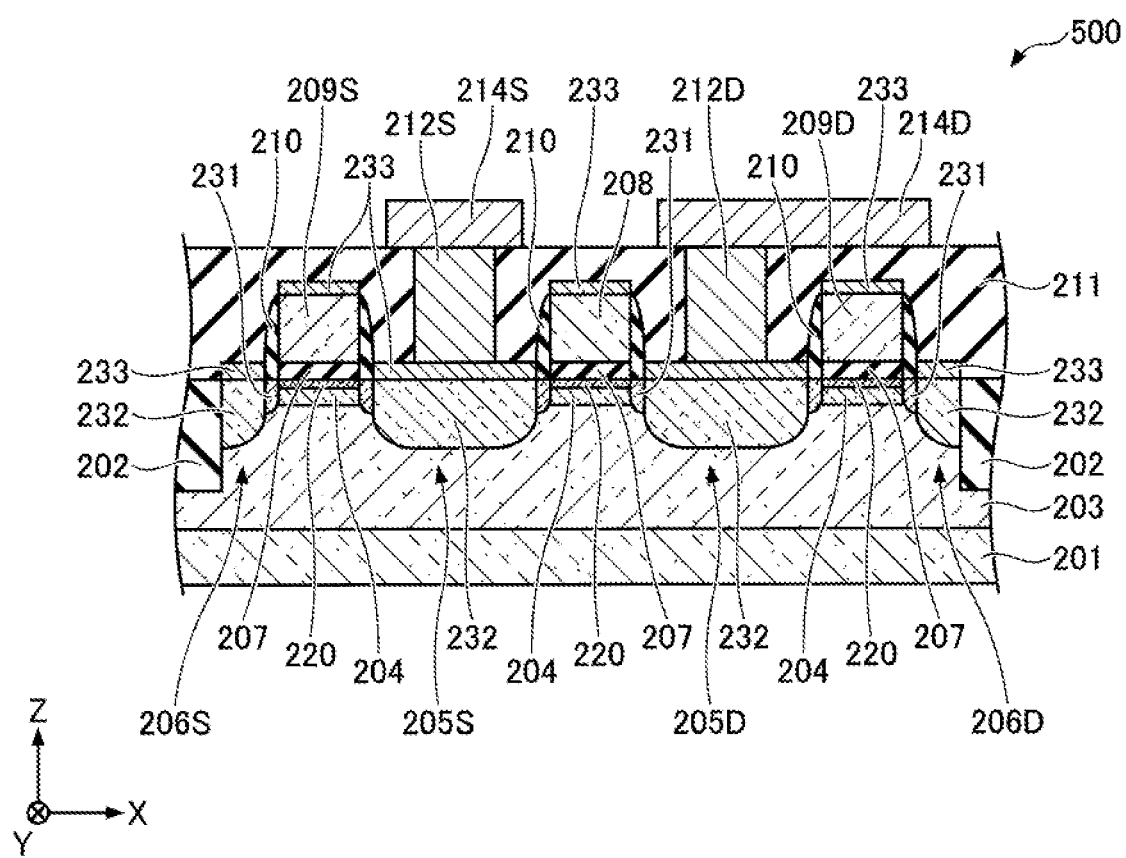
FIG. 6B is a cross-sectional view (part 1) illustrating the semiconductor device according to the fifth embodiment.
Figure 6C:
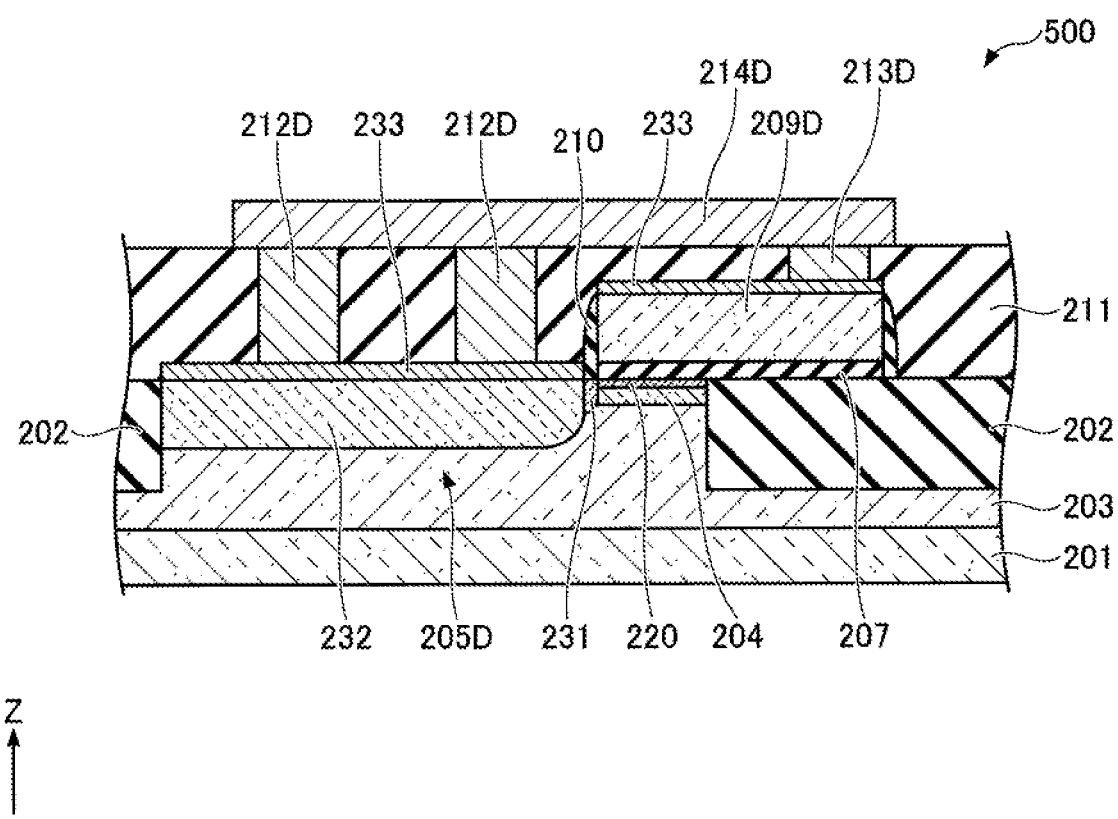
FIG. 6C is a cross-sectional view (part 2) illustrating the semiconductor device according to the fifth embodiment.

Next, a fifth embodiment will be described. FIG. 6A is a top view illustrating a semiconductor device according to the fifth embodiment, and FIG. 6B and FIG. 6C are cross-sectional views illustrating the semiconductor device according to the fifth embodiment. FIG. 6A mainly illustrates a positional relationship between a device isolation insulation film, source and drain semiconductor areas, electrodes, and interconnects. FIG. 6B corresponds to a cross-sectional view taken along line I-I of FIG. 6A. FIG. 6C corresponds to a cross-sectional view taken along line II-II of FIG. 6A.

As illustrated in FIG. 6A, FIG. 6B, and FIG. 6C, in a semiconductor device 500 according to the fifth embodiment, a silicon layer 220 is formed over a p-type semiconductor substrate 201, and a device isolation insulation film 202 that defines a device active area 260 is formed in a surface layer portion of a stack of the p-type semiconductor substrate 201 and the silicon layer 220. The semiconductor substrate 201 is, for example, a silicon substrate. The silicon layer 220 is, for example, an i-type non-doped silicon layer in which no impurity is introduced intentionally. The thickness of the silicon layer 220 is, for example, 10 nm to 40 nm. For the semiconductor substrate 201, although a device active area where a p-channel type transistor is formed and a device active area where an n-channel type transistor is formed both exist, FIG. 6A, FIG. 68, and FIG. 6C illustrate a device active area 260 in which an n-channel type transistor is formed. For example, a planar shape of the device active area 260 is in a rectangular shape. In the following description, a direction parallel to the long side of the device active area 260 is defined as the X direction, a direction parallel to the short side is defined as the Y direction, and a thickness direction of the semiconductor substrate 201 is defined as the Z direction. The Y direction is an example of the first direction.

A p well 203 is formed to include the device active area 260. For example, the p well 203 contains boron as a p-type impurity. For example, when the semiconductor substrate 201 is a p-type, the p well 203 can be omitted, and the semiconductor substrate 201 can also serve as a p-type area to operate as the p well 203. In that case, "p well 203" in this specification may be read as "semiconductor substrate 201" as appropriate. The gate electrode 208, the dummy gate electrode 209S and the dummy gate electrode 209D, which extend in the Y direction, are formed over the p well 203. The gate electrode 208 is located between the dummy gate electrode 209S and the dummy gate electrode 209D in the X direction. Gate insulating films 207 are formed between the gate electrode 208 and the silicon layer 220, between the dummy gate electrode 209S and the silicon layer 220, and between the dummy gate electrode 209D and the silicon layer 220. For example, the thickness of the gate insulating film 207 is 1.0 nm to 10.0 nm. The thicknesses of the gate electrode 208, the dummy gate electrode 209S, and the dummy gate electrode 209D are 50 nm to 200 nm. Examples of materials of the gate insulating film 207 include insulators such as silicon oxide, silicon nitride, and hafnium oxide. Examples of materials of the gate electrode 208, the dummy gate electrode 209S, and the dummy gate electrode 209D include polycrystalline silicon. Metals such as titanium and tungsten and nitrides of these metals can also be used as materials for the gate electrode 208, the dummy gate electrode 209S, and the dummy gate electrode 209D.

Both ends of the gate electrode 208 are located over the device isolation insulation film 202, and the gate electrode 208 includes an electrode pad 208A on one end of the gate electrode 208. The electrode pad 208A is wider in the X direction than a portion of the gate electrode 208 that overlaps the device active area 260 in planar view. Both ends of the dummy gate electrode 209D are located over the device isolation insulation film 202, and the dummy gate electrode 209D includes an electrode pad 209DA on the same end of the electrode pad 208A. The electrode pad 209DA is wider in the X direction than a portion of the dummy gate electrode 209D that overlaps the device active area 260 in planar view. Both ends of the dummy gate electrode 209S are located over the device isolation insulation film 202. In the embodiment, the electrode pad 208A and the electrode pad 209DA are arranged in the X direction, and the distance between the electrode pad 209DA and the device active area 260 is equal to the distance between the electrode pad 208A and the device active area 260 in the Y direction. The electrode pad 208A is an example of the first electrode pad, and the electrode pad 209DA is an example of the second electrode pad.

Spacers (sidewalls) 210 of an insulating film are formed on both sides of the gate electrode 208, the dummy gate electrode 209S, and the dummy gate electrode 209D in the X direction. In the surface layer portion of a stack of the p well 203 and the silicon layer 220, an n-type semiconductor area 231 is formed under the spacer 210 at a first depth, and n-type semiconductor areas 232 are formed, at a second depth deeper than the first depth, in portions exposed from the spacer 210, the gate electrode 208, the dummy gate electrode 209S, and the dummy gate electrode 209D. For example, the n-type semiconductor area 231 contains phosphorus as an n-type impurity at a first impurity concentration and the n-type semiconductor area 232 contains phosphorus as an n-type impurity at a second impurity concentration higher than the first impurity concentration. Among the n-type semiconductor areas 231 and 232, those located between the gate electrode 208 and the dummy gate electrode 209S are included in an n-type semiconductor area 205S, and those located between the gate electrode 208 and the dummy gate electrode 209D are included in an n-type semiconductor area 205D. Among the n-type semiconductor areas 231 and 232, those located between the dummy gate electrode 209S and the device isolation insulation film 202 are included in an n-type semiconductor area 206S, and those located between the dummy gate electrode 209D and the device isolation insulation film 202 are included in an n-type semiconductor area 206D. The n-type semiconductor area 205D is an example of the first semiconductor area.

Below the gate electrode 208, the dummy gate electrode 209S and the dummy gate electrode 209D, a p-type semiconductor area 204 is formed in the surface layer portion of the p well 203 between the n-type semiconductor areas 231. The p-type semiconductor area 204 contains, for example, boron as a p-type impurity. The p-type semiconductor area 204 may be referred to as a screen layer. Under the gate electrode 208, the silicon layer 220 is located between the p-type semiconductor area 204 and the gate insulating film 207. Below the dummy gate electrode 209S, the silicon layer 220 is located between the p well 203 and the gate insulating film 207. Below the dummy gate electrode 209D, the silicon layer 220 is located between the p well 203 and the gate insulating film 207. The silicon layer 220 is an example of a second semiconductor area and the p-type semiconductor area 204 is an example of a third semiconductor area.

For example, the dummy gate electrode 209S and the dummy gate electrode 209D are disposed alongside the gate electrode 208 and extend at least an entire portion over the p-type semiconductor area 204. For example, in the X direction, the distance between the gate electrode 208 and the dummy gate electrode 209S, and the distance between the gate electrode 208 and the dummy gate electrode 209D are constant throughout a portion of the gate electrode 208 over the p-type semiconductor area 204. The distance between the gate electrode 208 and the dummy gate electrode 209S may be the same as or may be different from the distance between the gate electrode 208 and the dummy gate electrode 209D.

A silicide layer 233 is formed on the n-type semiconductor area 232. The silicide layers 233 are also formed on the gate electrode 208, the dummy gate electrode 209S, and the dummy gate electrode 209D. The silicide layer 233 is a silicide layer of, for example, cobalt, nickel, tungsten, or titanium.

An interlayer insulating film 211 is formed over the semiconductor substrate 201 and the silicon layer 220 so as to cover the spacers 210 and the silicide layers 233. In the interlayer insulating film 211, a contact hole reaching the silicide layer 233 over the n-type semiconductor area 205S and a contact hole reaching the silicide layer 233 over the n-type semiconductor area 205D are formed. In the interlayer insulating film 211, a contact hole reaching the silicide layer 233 on the electrode pad 208A and a contact hole reaching the silicide layer 233 on the electrode pad 209DA are formed. A conductive plug 212S is embedded in the contact hole reaching the silicide layer 233 over the n-type semiconductor area 205S. A conductive plug 212D is embedded in the contact hole reaching the silicide layer 233 over the n-type semiconductor area 205D. A conductive plug 213 is embedded in the contact hole reaching the silicide layer 233 on the electrode pad 208A. A conductive plug 213D is embedded in the contact hole reaching the silicide layer 233 on the electrode pad 209DA. The conductive plugs 212S, 212D, 213, and 213D are, for example, tungsten plugs. An interconnect 214S connected to the conductive plug 212S and an interconnect 215 connected to the conductive plug 213 are formed on the interlayer insulating film 211. An interconnect 214D connected to the conductive plug 212D and the conductive plug 213D is formed on the interlayer insulating film 211. That is, the dummy gate electrode 209D and the n-type semiconductor area 205D are electrically connected through the interconnect 214D. The interconnect 214D is an example of a conductor.

For example, a signal is applied to the gate electrode 208 through the interconnect 215. The interconnect 214D is applied with a drain voltage of the transistor including the gate electrode 208, and the interconnect 214S is applied with a source voltage of the transistor including the gate electrode 208. For example, the potential of the n-type semiconductor areas 206S and 206D is floating.

In the semiconductor device 500 according to the fifth embodiment, as described above, the dummy gate electrode 209D and the n-type semiconductor area 205D are electrically connected through the interconnect 214D. Thus, the potential of the dummy gate electrode 209D is equal to the potential of the n-type semiconductor area 205D, and an inversion layer is formed in the p-type semiconductor area 204 under the dummy gate electrode 209D. Therefore, an electric field of the pn junction under the dummy gate electrode 209D can be more moderate than an electric field of the pn junction under the gate electrode 208, and a junction leakage current can be suppressed.

For example, a drain voltage is 0.5 V and a source voltage is 0 V, and a bias voltage of −0.5 V is applied to the p well 203 through the semiconductor substrate 201. In this state, a junction leakage current can be suppressed when a voltage of the gate electrode 208 is 0 V. By applying a negative bias voltage, a subthreshold leakage current between the source and the drain can be reduced.

Additionally, since the silicon layer 220, which is non-doped and has a very low impurity concentration, is provided beneath the gate insulating film 207 under the gate electrode 208, variations in characteristics due to random variations of the impurity can be suppressed.

Next, a manufacturing method for manufacturing the semiconductor device 500 according to the fifth embodiment will be described. FIG. 7A to FIG. 7F are cross-sectional views illustrating the manufacturing method for manufacturing the semiconductor device according to the fifth embodiment. FIG. 7A to FIG. 7F illustrate parts corresponding to the cross-sectional views taken along line I-I of FIG. 6A.

Figure 7A:
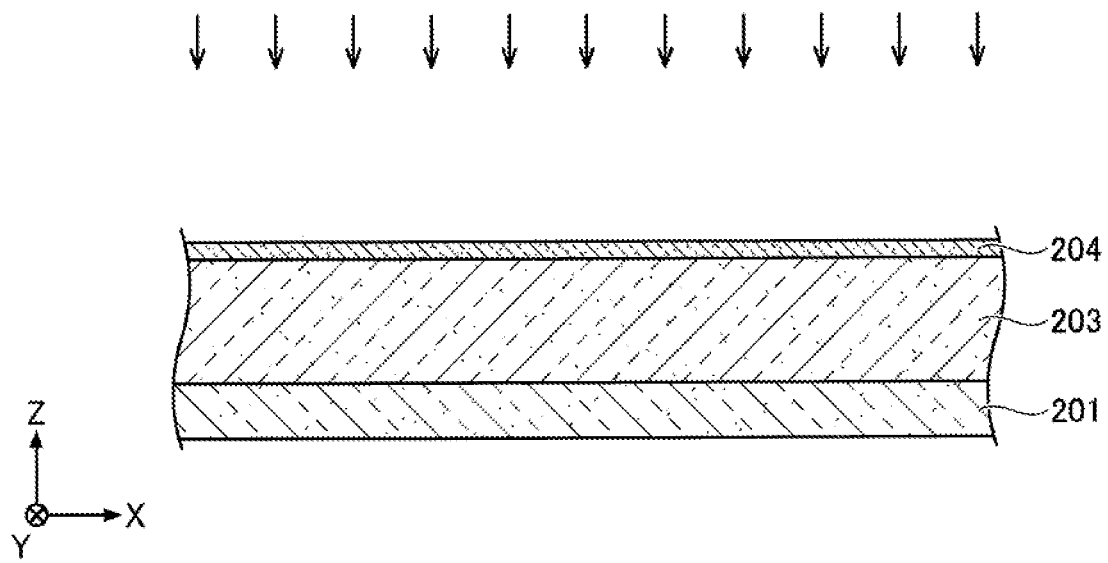
FIG. 7A is a cross-sectional view (part 1) illustrating a manufacturing method for manufacturing the semiconductor device according to the fifth embodiment.

First, as illustrated in FIG. 7A, the p well 203 is formed in the surface layer portion of the semiconductor substrate 201. For example, the p well 203 can be formed by forming a mask of photoresist (which is not illustrated) having an opening for an area where the p well 203 is to be formed over the semiconductor substrate 201 and performing ion-implantation of a p-type impurity using the mask. For example, boron is ion-implanted as the p-type impurity at an energy of 100 keV to 300 keV and a dose of $1.0 \times 10^{13}$ cm$^{-2}$ to $3.0 \times 10^{14}$ cm$^{-2}$. The mask is removed after the ion implantation of the p-type impurity. For example, when the semiconductor substrate 201 is a p-type and has a desired concentration, forming the p well 203 can be omitted, and the semiconductor substrate 201 can also serve as a p-type area to operate as the p well 203. In that case, "p well 203" in this specification may be read as "semiconductor substrate 201" as appropriate.

Next, likewise, as illustrated in FIG. 7A, the p-type semiconductor area 204 is formed in the surface layer portion of the p well 203 by forming a mask of photoresist (which is not illustrated), having an opening for forming the p-type semiconductor area 204, over the semiconductor substrate 201, and performing ion-implantation of a p-type impurity using the mask. For example, boron is ion-implanted as the p-type impurity at an energy of 0.3 keV to 20 keV and a dose of $1.0 \times 10^{12}$ cm$^{-2}$ to $1.0 \times 10^{14}$ cm$^{-2}$. BF$_2$ may be ion-implanted as the p-type impurity at an energy of 3 keV to 30 keV and a dose of $1.0 \times 10^{12}$ cm$^{-2}$ to $1.0 \times 10^{14}$ cm$^{-2}$. The mask is removed after the ion implantation of the p-type impurity.

Figure 7B:
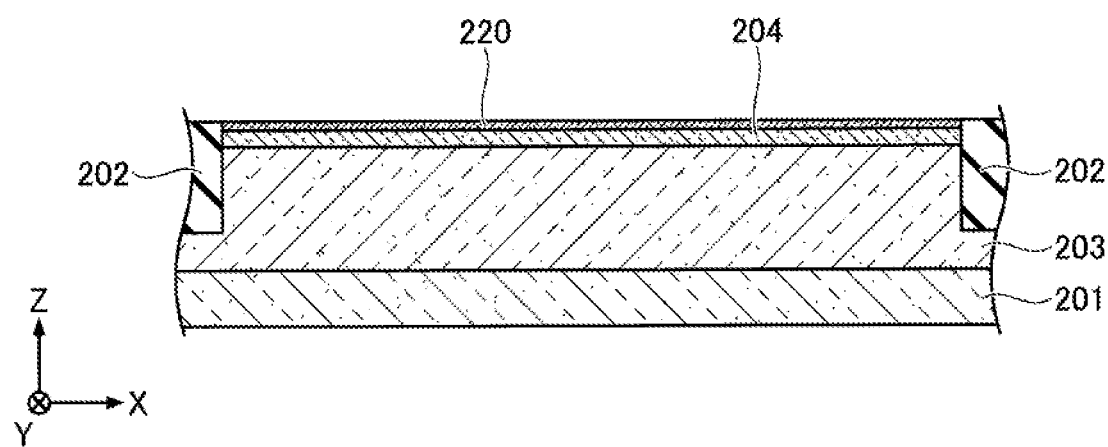
FIG. 7B is a cross-sectional view (part 2) illustrating the manufacturing method for manufacturing the semiconductor device according to the fifth embodiment.

As illustrated in FIG. 7B, the silicon layer 220 is formed over the semiconductor substrate 201. The silicon layer 220 can be formed by, for example, epitaxial growth. In a manufacturing process, the impurity concentration of the silicon layer 220 can be unintentionally increased by impurity diffusion from another impurity area. Here, for example, the impurity concentration of the silicon layer 220 may be about $1.0 \times 10^{17}$ cm$^{-3}$ or less. With respect to this, the silicon layer 220 is an i-type non-doped silicon layer in which no impurity is introduced intentionally. Next, the device isolation insulation film 202 that defines the device active area 260 is formed in the surface layer portion of the stack of the semiconductor substrate 201 and the silicon layer 220. The device isolation insulation film 202 can be formed by, for example, the STI method.

Figure 7C:
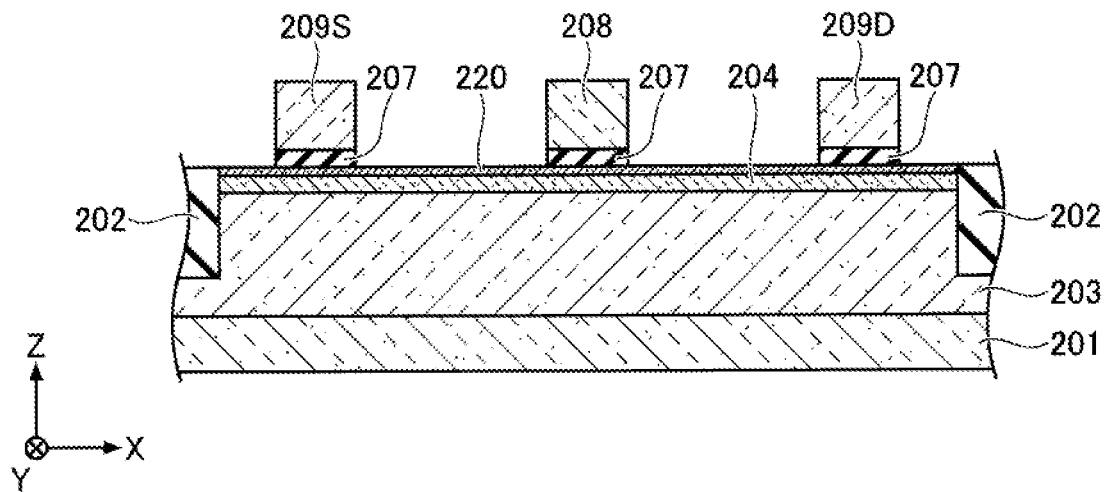
FIG. 7C is a cross-sectional view (part 3) illustrating the manufacturing method for manufacturing the semiconductor device according to the fifth embodiment.

Next, as illustrated in FIG. 7C, the gate insulating film 207, the gate electrode 208, the dummy gate electrode 209S, and the dummy gate electrode 209D are formed. For example, an insulating film and a polysilicon film are formed over the semiconductor substrate 201, and these are processed by photolithography and etching. This can form the gate insulating film 207, the gate electrode 208, the dummy gate electrode 209S, and the dummy gate electrode 209D. In the photolithography, the exposure and development of a photoresist are performed using a single exposure mask on which a pattern for the gate electrode 208, a pattern for the dummy gate electrode 209S, and a pattern for the dummy gate electrode 209D are formed. The pattern for the gate electrode 208 includes a pattern for the electrode pad 208A, and the pattern for the dummy gate electrode 209D includes a pattern for the electrode pad 209DA.

Figure 7D:
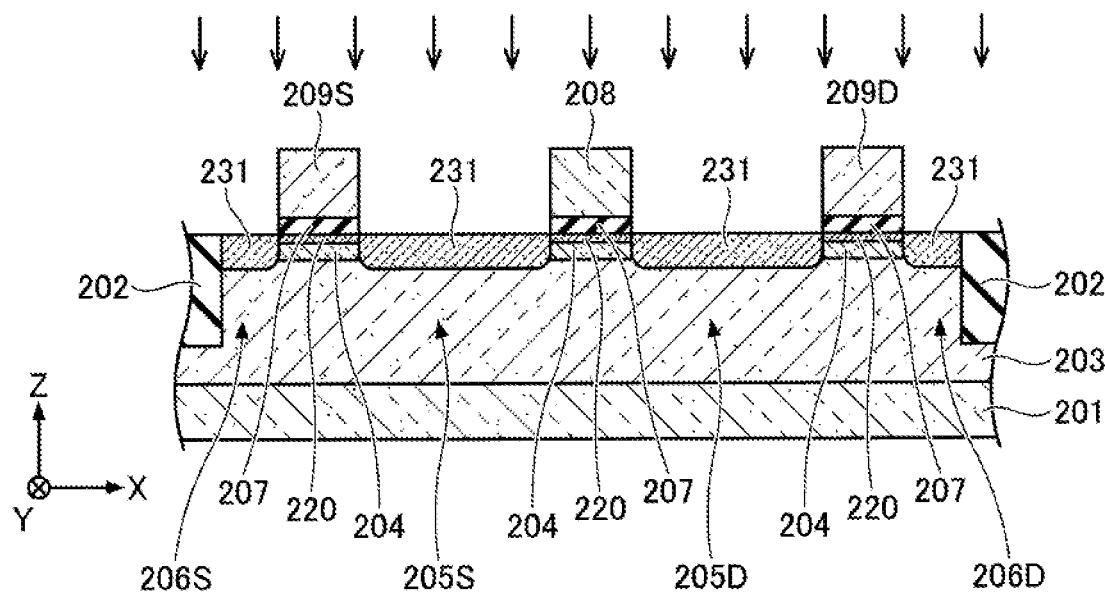
FIG. 7D is a cross-sectional view (part 4) illustrating the manufacturing method for manufacturing the semiconductor device according to the fifth embodiment.

Next, as illustrated in FIG. 7D, in the device active area 260, the n-type semiconductor area 231 having the first impurity concentration is formed by performing ion-implantation of an n-type impurity using the gate electrode 208, the dummy gate electrode 209S, and the dummy gate electrode 209D as a mask. For example, phosphorus is ion-implanted as the n-type impurity at an energy of 5 keV to 20 keV and a dose of $1.0 \times 10^{13}$ cm$^{-2}$ to $1.0 \times 10^{15}$ cm$^{-2}$.

Figure 7E:
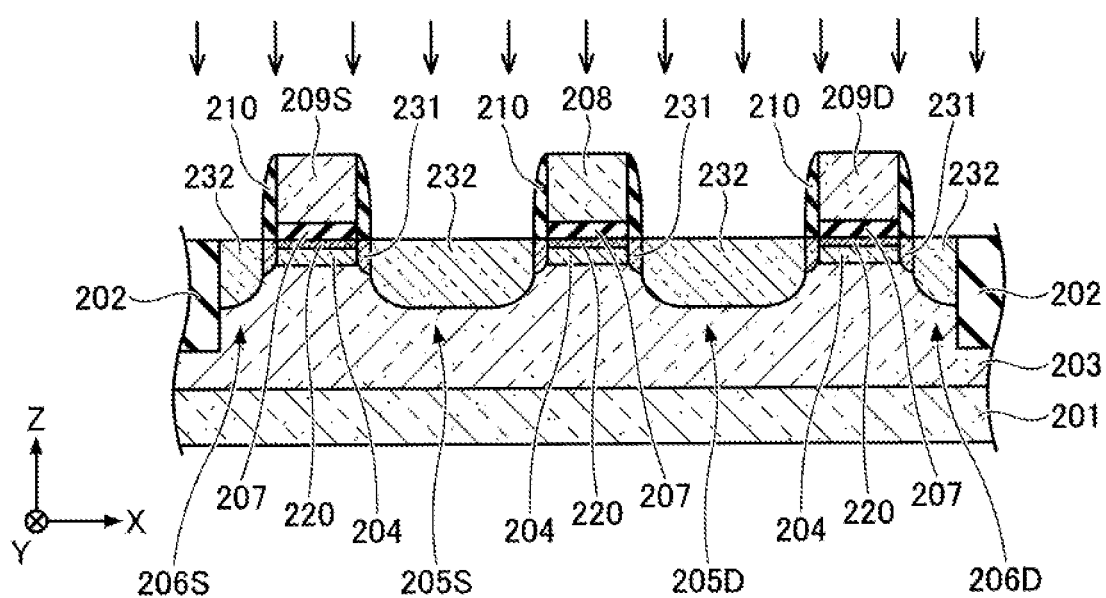
FIG. 7E is a cross-sectional view (part 5) illustrating the manufacturing method for manufacturing the semiconductor device according to the fifth embodiment.

As illustrated in FIG. 7E, spacers 210 of an insulating film are formed on both sides of the gate electrode 208, the dummy gate electrode 209S, and the dummy gate electrode 209D. Next, in the device active area 260, the n-type semiconductor area 232 having a second impurity concentration higher than the first impurity concentration is formed to be deeper than the n-type semiconductor area 231 by performing ion-implantation of an n-type impurity using the spacer 210, the gate electrode 208, the dummy gate electrode 209S, and the dummy gate electrode 209D as a mask. For example, phosphorus is ion-implanted as the n-type impurity at an energy of 5 keV to 30 keV and a dose of $1.0 \times 10^{15}$ cm$^{-2}$ to $3.0 \times 10^{16}$ cm$^{-2}$. In planar view, the n-type semiconductor areas 231 and 232 located between the gate electrode 208 and the dummy gate electrode 209S constitute the n-type semiconductor area 205S, and the n-type semiconductor areas 231 and 232 located between the gate electrode 208 and the dummy gate electrode 209D constitute the n-type semiconductor area 205D. In planar view, the n-type semiconductor areas 231 and 232 located on a dummy gate electrode 209S side opposite to the gate electrode 208 constitute the n-type semiconductor area 206S, and the n-type semiconductor areas 231 and 232 located on a dummy gate electrode 209D side opposite to the gate electrode 208 constitute the n-type semiconductor area 206D.

Figure 7F:
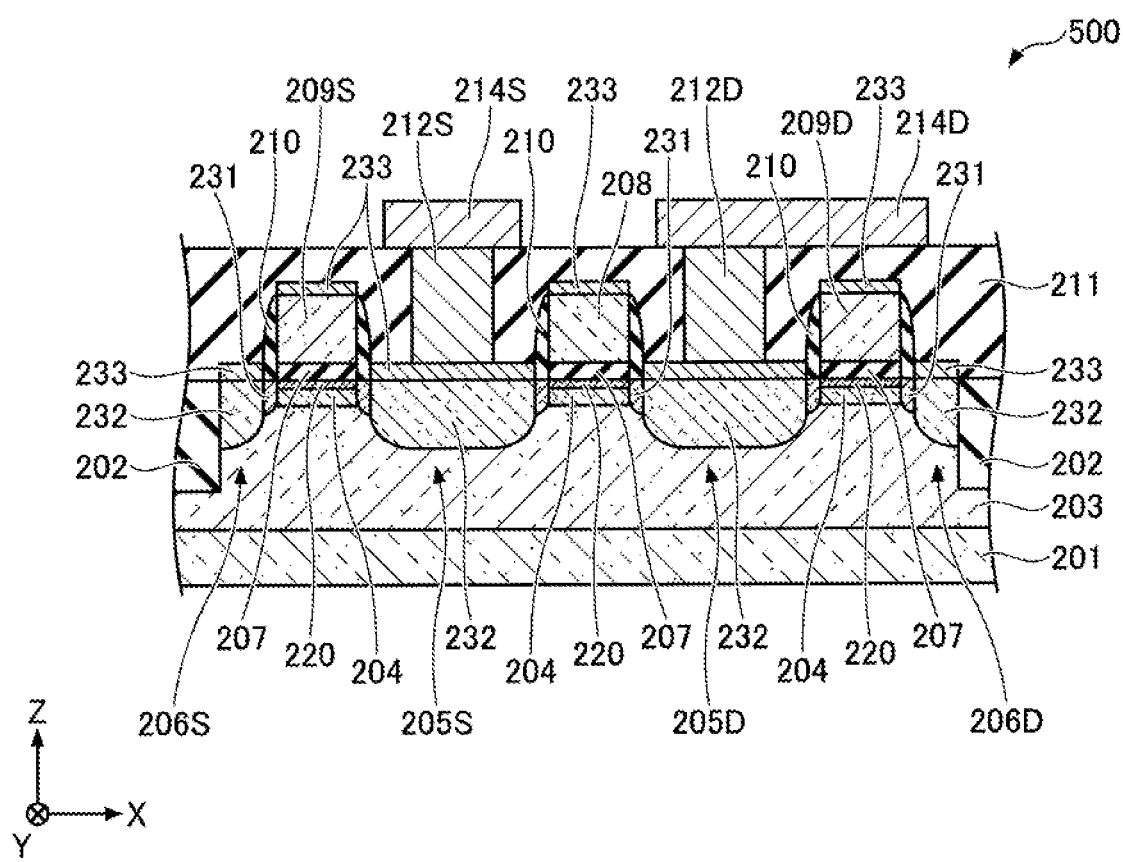
FIG. 7F is a cross-sectional view (part 6) illustrating the manufacturing method for manufacturing the semiconductor device according to the fifth embodiment.

Next, as illustrated in FIG. 7F, the silicide layers 233 are formed on the n-type semiconductor area 232, the gate electrode 208, the dummy gate electrode 209S, and the dummy gate electrode 209D. Subsequently, the interlayer insulating film 211 is formed over the semiconductor substrate 201 and the silicon layer 220, and a surface of the interlayer insulating film 211 is smoothed by the CMP method or the like. Next, in the interlayer insulating film 211, a contact hole reaching the silicide layer 233 over the n-type semiconductor area 205S, a contact hole reaching the silicide layer 233 over the n-type semiconductor area 205D, a contact hole reaching the silicide layer 233 on the electrode pad 208A, and a contact hole reaching the silicide layer 233 on the electrode pad 209DA are formed. Conductive films are formed in these contact holes. As a result, the conductive plug 212S connected to the silicide layer 233 over the n-type semiconductor area 205S, the conductive plug 212D connected to the silicide layer 233 over the n-type semiconductor area 205D, the conductive plug 213 (see FIG. 6A) connected to the silicide layer 233 on the electrode pad 208A, and the conductive plug 213D (see FIG. 6A and FIG. 6C) connected to the silicide layer 233 on the electrode pad 209DA are formed. Next, the interconnect 214S connected to the conductive plugs 212S, the interconnect 215 connected to the conductive plug 213, and the interconnect 214D connected to the conductive plug 212D and the conductive plug 213D are formed on the interlayer insulating film 211.

The semiconductor device 500 is completed by forming an interconnect or the like on an upper layer as needed.

In this manufacturing method, in the photolithography for forming the gate electrode 208, the dummy gate electrode 209S and the dummy gate electrode 209D, the photoresist is exposed and developed using a single exposure mask on which the pattern for the gate electrode 208, the pattern for the dummy gate electrode 209S, and the pattern for the dummy gate electrode 209D are formed. Therefore, even when the gate electrode 208 of an actually-operated transistor is formed in an area where the pattern density is low, the pattern density is supplemented by the pattern for the dummy gate electrode 209S and the pattern for the dummy gate electrode 209D, which can increase the pattern density uniformity of the exposure mask. Therefore, the processing accuracy of the gate electrode 208 is less affected by the pattern density.

As in the fifth embodiment, a structure including the silicon layer and the p-type semiconductor area (i.e., the screen layer) may be applied to the second embodiment, the third embodiment, or the fourth embodiment.

Sixth Embodiment

Figure 8A:
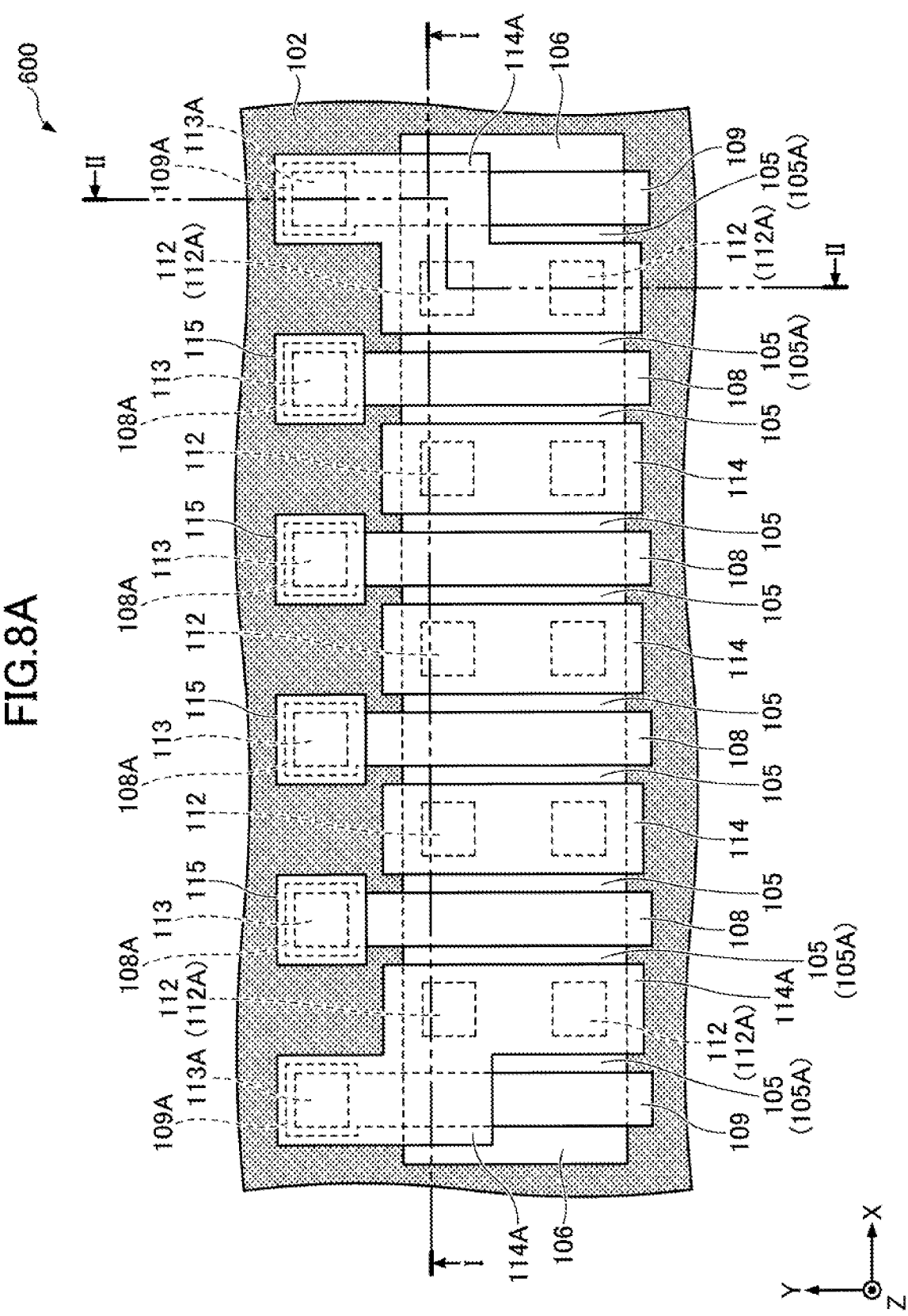
FIG. 8A is a top view illustrating a semiconductor device according to a sixth embodiment.
Figure 8B:
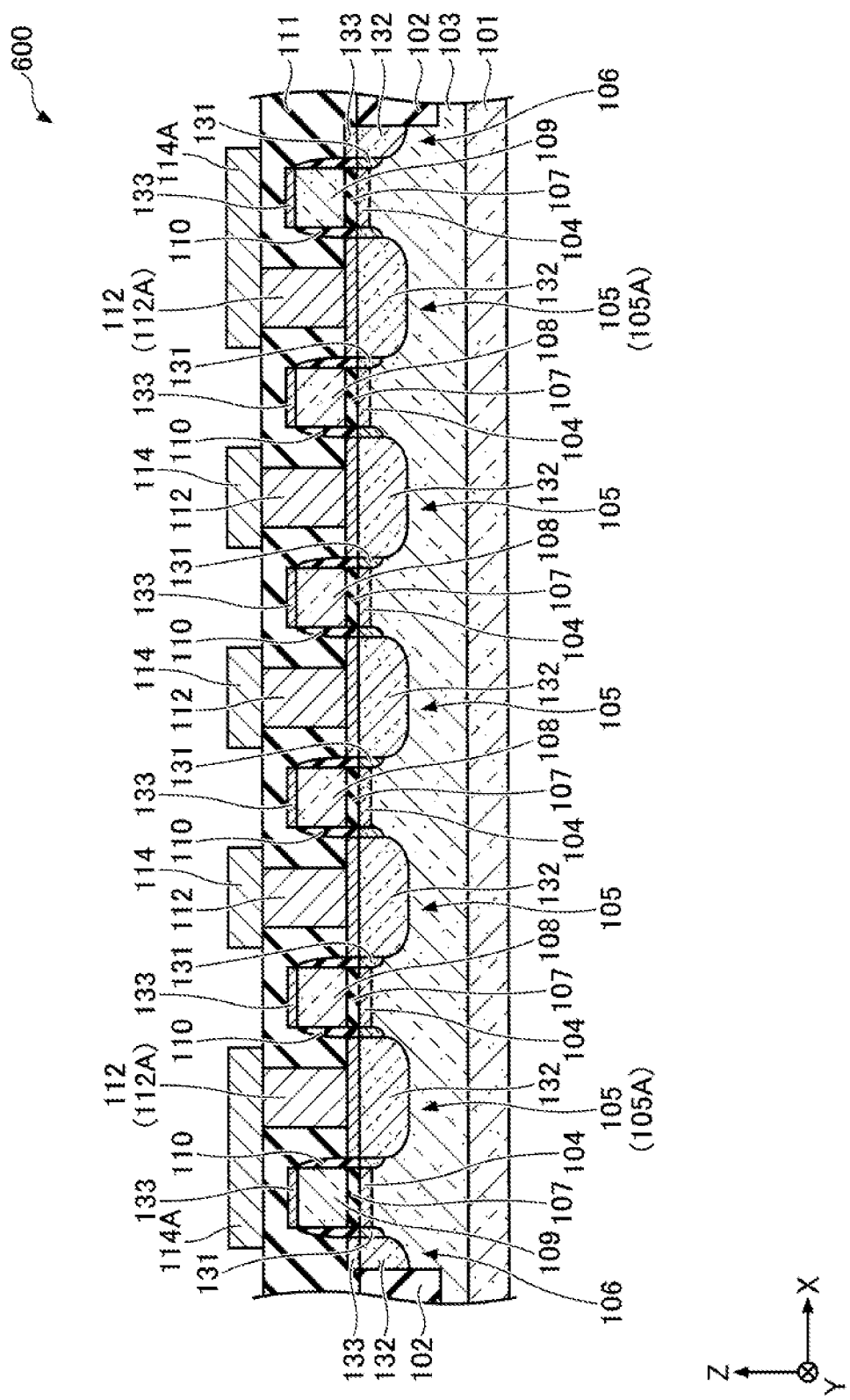
FIG. 8B is a cross-sectional view (part 1) illustrating the semiconductor device according to the sixth embodiment.
Figure 8C:
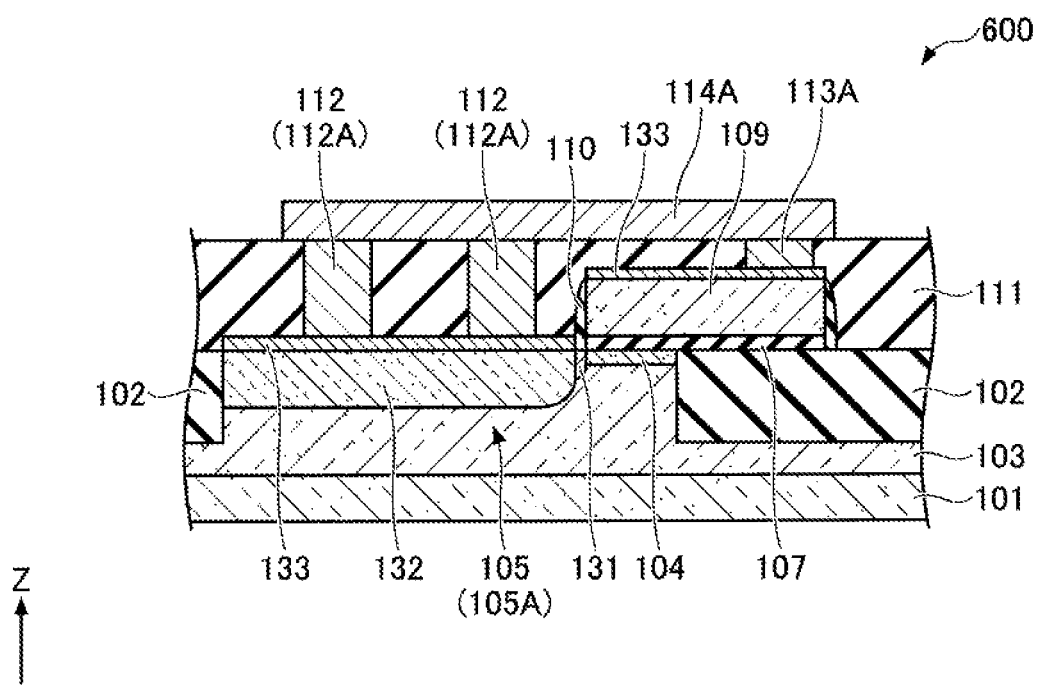
FIG. 8C is a cross-sectional view (part 2) illustrating the semiconductor device according to the sixth embodiment.

Next, a sixth embodiment will be described. FIG. 8A is a top view illustrating a semiconductor device according to the sixth embodiment, and FIG. 8B and FIG. 8C are cross-sectional views illustrating the semiconductor device according to the sixth embodiment. FIG. 8A mainly illustrates a positional relationship between a device isolation insulation film, source and drain semiconductor areas, electrodes, and interconnects. FIG. 8B corresponds to a cross-sectional view taken along line I-I of FIG. 8A. FIG. BC corresponds to a cross-sectional view taken along line II-II of FIG. 8A.

In the first embodiment, one gate electrode 108 is disposed between the dummy gate electrode 109S and the dummy gate electrode 109D. In the semiconductor device 600 according to the sixth embodiment, as illustrated in FIG. 8A, FIG. 8B, and FIG. 8C, multiple gate electrodes 108 (e.g., four gate electrodes 108) are disposed between two dummy gate electrodes 109. Intervals between four gate electrodes 108 are constant, and the gate length of four gate electrodes 108 is the same. The gate insulating films 107 are formed between the gate electrode 108 and the p well 103 and between the dummy gate electrode 109 and the p well 103. Both ends of the dummy gate electrode 109 are located over the device isolation insulation film 102, and the dummy gate electrode 109 includes an electrode pad 109A on the same end of the electrode pad 108A. The electrode pad 109A is wider in the X direction than a portion of the dummy gate electrode 109 that overlaps the device active area 160 in planar view. In the present embodiment, the electrode pads 108A and the electrode pads 109A are arranged to be side by side in the X direction, and the distance between each electrode pad 109A and the device active area 160 is equal to the distance between each electrode pad 108A and the device active area 160 in the Y direction.

Spacers (sidewalls) 110 of an insulating film are formed on both sides of the gate electrode 108 and the dummy gate electrode 109 in the X direction. In the surface layer portion of the p well 103, an n-type semiconductor area 131 is formed under the spacer 110 at a first depth, and n-type semiconductor areas 132 are formed, at a second depth deeper than the first depth, in portions exposed from the spacer 110, the gate electrode 108, and the dummy gate electrode 109. Among the n-type semiconductor areas 131 and 132, those located between the gate electrode 108 and the dummy gate electrode 109 are included in an n-type semiconductor area 105. Among the n-type semiconductor areas 131 and 132, those located between the dummy gate electrode 109 and the device isolation insulation film 102 are included in an n-type semiconductor area 106.

Below the gate electrode 108 and the dummy gate electrode 109, a p-type semiconductor area 104 is formed in the surface layer portion of the p well 103 between the n-type semiconductor areas 131.

For example, the dummy gate electrode 109 is disposed alongside the gate electrode 108 and extends at least an entire portion over the p-type semiconductor area 104. For example, in the X direction, the distance between the gate electrode 108 and the dummy gate electrode 109 is constant throughout a portion of the gate electrode 108 over the p-type semiconductor area 104. The distance between the gate electrode 108 and one dummy gate electrode 109 may be the same as or may be different from the distance between the gate electrode 108 and another dummy gate electrode 109.

The silicide layer 133 is formed on the n-type semiconductor area 132. The silicide layers 133 are also formed on the gate electrode 108 and the dummy gate electrode 109.

The interlayer insulating film 111 is formed over the semiconductor substrate 101 so as to cover the spacers 110 and the silicide layers 133. In the interlayer insulating film 111, a contact hole reaching the silicide layer 133 over the n-type semiconductor area 105, a contact hole reaching the silicide layer 133 on the electrode pad 108A, and a contact hole reaching the silicide layer 133 on the electrode pad 109A are formed. A conductive plug 112 is embedded in the contact hole reaching the silicide layer 133 over the n-type semiconductor area 105, a conductive plug 113 is embedded in the contact hole reaching the silicide layer 133 on the electrode pad 108A, and a conductive plug 113A is embedded in the contact hole reaching the silicide layer 133 on the electrode pad 109A. The conductive plugs 112, 113, and 113A are, for example, tungsten plugs. Multiple interconnects 115 each connecting the conductive plug 113 are formed on the interlayer insulating film 111. Multiple interconnects 114 each connecting the conductive plugs 112 located between two gate electrodes 108 provided side by side in the X direction are formed on the interlayer insulating film 111. Two interconnects 114A that are connecting the conductive plug 112 (or 112A) located between the gate electrode 108 and the dummy gate electrode 109 provided side by side in the X direction, and that are connecting the conductive plug 113A on the dummy gate electrode 109, are formed on the interlayer insulating film ill. That is, the dummy gate electrode 109 and the n-type semiconductor area 105D (or 105A) located between the gate electrode 108 and the dummy gate electrode 109 provided side by side in the X direction are electrically connected through the interconnects 114A. Other configurations are similar to the configuration of the first embodiment.

In the semiconductor device 600 according to the sixth embodiment, as described above, the dummy gate electrode 109 and the n-type semiconductor area 105A are electrically connected through the interconnect 114A. Thus, the potential of the dummy gate electrode 109 is equal to the potential of the n-type semiconductor area 105A, and an inversion layer is formed in the p-type semiconductor area 104 under the dummy gate electrode 109. Therefore, an electric field of the pn junction under the dummy gate electrode 109 can be more moderate than an electric field of the pn junction under the gate electrode 108, and a junction leakage current can be suppressed.

In a manufacturing method for manufacturing the semiconductor device 600, in the photolithography for forming the gate electrode 108 and the dummy gate electrode 109, the photoresist is exposed and developed using a single exposure mask on which the pattern for the gate electrode 108 and the pattern for the dummy gate electrode 109 are formed. The manufacturing method can provide good uniformity of the gate length between the four gate electrodes 108. This is because the pattern densities around the gate electrodes 108 on the exposure mask are highly uniform.

A structure in which multiple gate electrodes are disposed between two dummy gate electrodes may be applied to the second, third, fourth, and fifth embodiments.

In the present disclosure, the impurity is not particularly limited. For example, arsenic (As) or antimony (Sb) may be used as an n-type impurity, and indium (In) or aluminum (Al) may be used as a p-type impurity. Further, the conductive type of a transistor to which the present disclosure can be applied is not particularly limited, and the present disclosure may be applied to a p-channel type transistor.

In the present disclosure, a silicide layer on a gate electrode can be considered as a part of the gate electrode, a silicide layer on a dummy gate electrode can be considered as a part of the dummy gate electrode, and a silicide layer on an impurity region can be considered as a part of the impurity region.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A semiconductor device comprising:
    a semiconductor substrate;
    a gate electrode disposed over the semiconductor substrate and extending in a first direction;
    a dummy gate electrode disposed over the semiconductor substrate away from the gate electrode and extending in the first direction;
    a first semiconductor area of a first conductive type disposed in the semiconductor substrate;
    a second semiconductor area of a second conductive type different from the first conductive type disposed in a surface layer portion of the first semiconductor area between the gate electrode and the dummy gate electrode; and
    a conductor electrically connecting the second semiconductor area with the dummy gate electrode,
    wherein a first voltage is applied to the first semiconductor area, a second voltage is applied to the second semiconductor area being an n conductive type, and the second voltage is higher than the first voltage; or
    a third voltage is applied to the first semiconductor area, a fourth voltage is applied to the second semiconductor area being a p conductive type, and the fourth voltage is lower than the third voltage.

2. The semiconductor device as claimed in claim 1, wherein the dummy gate electrode is disposed alongside the gate electrode and extends at least an entirety of a portion of the gate electrode over the second semiconductor area.

3. The semiconductor device as claimed in claim 1, wherein a distance between the gate electrode and the dummy gate electrode is constant throughout an entirety of a portion of the gate electrode over the second semiconductor area.

4. The semiconductor device as claimed in claim 1, comprising an insulation film covering the gate electrode and the dummy gate electrode,
    wherein the conductor includes a conductive plug that is formed in a contact hole formed in the insulation film, that is continuously in contact with an upper layer of the second semiconductor area and an upper layer of the dummy gate electrode, and that is electrically connected to the second semiconductor area and the dummy gate electrode.

5. The semiconductor device as claimed in claim 4, wherein the conductive plug has a shape in which length in a second direction orthogonal to the first direction is longer than length in the first direction in planar view.

6. The semiconductor device as claimed in claim 1, comprising a device isolation area disposed in the surface layer portion of the semiconductor substrate and defining a device active area,
    wherein the gate electrode includes a first electrode pad located over the device isolation area,
    wherein the dummy gate electrode includes a second electrode pad located over the device isolation area, and
    wherein the first electrode pad is located in an area on a side of the device active area and the second electrode pad is located in an area on an opposite side of the device active area in the first direction.

7. The semiconductor device as claimed in claim 1, comprising a device isolation area disposed in the surface layer portion of the semiconductor substrate and defining a device active area,
    wherein the gate electrode includes a first electrode pad located over the device isolation area,
    wherein the dummy gate electrode includes a second electrode pad located over the device isolation area, and
    wherein the first electrode pad and the second electrode pad are located in an area on a same side of the device active area in the first direction.

8. The semiconductor device as claimed in claim 7, wherein a distance between the first electrode pad and the device active area is different from a distance between the second electrode pad and the device active area.

9. The semiconductor device as claimed in claim 1, comprising:

a third semiconductor area that is non-doped and disposed over the surface layer portion of the semiconductor substrate under the gate electrode; and a fourth semiconductor area of the first conductive type disposed under the third semiconductor area and in the surface layer portion of the first semiconductor area.

10. The semiconductor device as claimed in claim 1, wherein the dummy gate electrode includes two dummy gate electrodes, and the gate electrode is disposed between the two dummy gate electrodes.

11. The semiconductor device as claimed in claim 10, wherein the gate electrode includes two or more gate electrodes that are disposed between the two dummy gate electrodes.

12. A manufacturing method for manufacturing a semiconductor device, comprising:

forming a first semiconductor area of a first conductive type in a semiconductor substrate;

forming a gate electrode over the semiconductor substrate, the gate electrode extending in a first direction;

forming a dummy gate electrode over the semiconductor substrate away from the gate electrode, the dummy gate electrode extending in the first direction;

forming a second semiconductor area of a second conductive type different from the first conductive type in a surface layer portion of the first semiconductor area between the gate electrode and the dummy gate electrode; and forming a conductor electrically connecting the second semiconductor area with the dummy gate electrode, wherein the forming the gate electrode and the forming the dummy gate electrode include exposing a photoresist and developing the photoresist by using a single exposure mask on which a pattern for the gate electrode and a pattern for the dummy gate electrode are formed; and wherein a first voltage is applied to the first semiconductor area, a second voltage is applied to the second semiconductor area being an n conductive type, and the second voltage is higher than the first voltage; or a third voltage is applied to the first semiconductor area, a fourth voltage is applied to the second semiconductor area being a p conductive type, and the fourth voltage is lower than the third voltage.

13. The manufacturing method for manufacturing the semiconductor device as claimed in claim 12, wherein the forming the dummy gate electrode includes forming the dummy gate electrode alongside the gate electrode, the dummy gate electrode extending at least an entirety of a portion of the gate electrode over the second semiconductor area.

14. The manufacturing method for manufacturing the semiconductor device as claimed in claim 12, wherein a distance between the gate electrode and the dummy gate electrode is constant throughout an entirety of a portion of the gate electrode over the second semiconductor area.

15. The manufacturing method for manufacturing the semiconductor device as claimed in claim 12, comprising forming an insulation film covering the gate electrode and the dummy gate electrode, wherein the forming the conductor includes forming a contact hole in the insulation film and forming a conductive plug in the contact hole, the conductive plug being electrically connected to the second semiconductor area and the dummy gate electrode.

16. The manufacturing method for manufacturing the semiconductor device as claimed in claim 12, comprising:

forming a third semiconductor area that is non-doped over the surface layer portion of the semiconductor substrate under the gate electrode; and forming a fourth semiconductor area of the first conductive type under the third semiconductor area and in the surface layer portion of the first semiconductor area.

\* \* \* \* \*